United States Patent
Kwak et al.

(10) Patent No.: US 11,545,534 B2
(45) Date of Patent: Jan. 3, 2023

(54) DISPLAY DEVICE INCLUDING A FAN OUT UNIT AND A TEST LINE IN THE PERIPHERAL AREA

(71) Applicant: SAMSUNG DISPLAY CO., LTD., Yongin-si (KR)

(72) Inventors: Minchae Kwak, Yongin-si (KR); Hwayoung Song, Yongin-si (KR); Junyoung Jo, Yongin-si (KR); Jihyun Ka, Yongin-si (KR); Byungsun Kim, Yongin-si (KR); Ilgoo Youn, Yongin-si (KR); Jieun Lee, Yongin-si (KR); Seunghan Jo, Yongin-si (KR); Minhee Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 199 days.

(21) Appl. No.: 16/940,921

(22) Filed: Jul. 28, 2020

(65) Prior Publication Data
US 2021/0036091 A1    Feb. 4, 2021

(30) Foreign Application Priority Data

Jul. 29, 2019    (KR) .................. 10-2019-0092044

(51) Int. Cl.
*H01L 29/08*    (2006.01)
*H01L 27/32*    (2006.01)

(52) U.S. Cl.
CPC ...... *H01L 27/3276* (2013.01); *H01L 27/3262* (2013.01); *H01L 27/3265* (2013.01)

(58) Field of Classification Search
CPC ............ H01L 27/3276; H01L 27/3262; H01L 27/3265
USPC ......................................................... 257/40
See application file for complete search history.

(56) References Cited

U.S. PATENT DOCUMENTS

| | | |
|---|---|---|
| 9,099,054 B2 | 8/2015 | Kim |
| 9,128,337 B2 | 9/2015 | Lee et al. |
| 9,224,352 B2 | 12/2015 | Watanabe et al. |
| 9,349,322 B2 | 5/2016 | Kim et al. |
| 9,837,038 B2 | 12/2017 | Lee |
| 9,893,093 B2 | 2/2018 | Kim et al. |
| 10,134,327 B2 | 11/2018 | Park et al. |
| 10,411,083 B2 | 9/2019 | Song et al. |
| 2007/0296659 A1* | 12/2007 | Kwak ................ G02F 1/13452 349/56 |
| 2010/0155729 A1* | 6/2010 | Yang .................... H05K 1/0265 257/E27.113 |

(Continued)

FOREIGN PATENT DOCUMENTS

| | | |
|---|---|---|
| EP | 3176769 | 6/2017 |
| EP | 3246912 | 11/2017 |

(Continued)

*Primary Examiner* — Phuc T Dang
(74) *Attorney, Agent, or Firm* — F. Chau & Associates, LLC

(57) ABSTRACT

A display device including: a substrate including a display area and a peripheral area adjacent to the display area; a plurality of data lines extending in a first direction in the display area; a fan-out unit arranged in the peripheral area and connected to the plurality of data lines; a first signal line arranged in the peripheral area; and a common power supply line arranged in the peripheral area and overlapping the fan-out unit.

30 Claims, 18 Drawing Sheets

(56) References Cited

U.S. PATENT DOCUMENTS

| | | | |
|---|---|---|---|
| 2012/0098811 A1* | 4/2012 | Park | G02F 1/136286 345/211 |
| 2014/0117320 A1* | 5/2014 | Jung | H01L 27/3276 257/40 |
| 2017/0337859 A1* | 11/2017 | Hirata | G09G 3/006 |
| 2017/0338295 A1 | 11/2017 | Lee et al. | |
| 2018/0182274 A1 | 6/2018 | Jung et al. | |
| 2019/0043938 A1* | 2/2019 | Lee | H01L 27/124 |
| 2019/0103455 A1* | 4/2019 | Song | H01L 27/3279 |

FOREIGN PATENT DOCUMENTS

| | | |
|---|---|---|
| EP | 3282441 | 2/2018 |
| KR | 10-2013-0061884 | 6/2013 |
| KR | 10-2016-0013359 | 2/2016 |
| KR | 10-2016-0082883 | 7/2016 |
| KR | 10-2016-0133054 | 11/2016 |
| KR | 10-2017-0061781 | 6/2017 |
| KR | 10-2017-0130016 | 11/2017 |
| KR | 10-1853454 | 5/2018 |
| KR | 10-2019-0038718 | 4/2019 |

* cited by examiner

DISPLAY DEVICE INCLUDING A FAN OUT UNIT AND A TEST LINE IN THE PERIPHERAL AREA

CROSS-REFERENCE TO RELATED APPLICATION

This application claims priority under 35 U.S.C. § 119 to Korean Patent Application No. 10-2019-0092044, filed on Jul. 29, 2019, in the Korean Intellectual Property Office, the disclosure of which is incorporated by reference herein in its entirety.

1. TECHNICAL FIELD

Exemplary embodiments of the inventive concept relate to a display device, and more particularly, to a display device having a small peripheral area.

2. DESCRIPTION OF RELATED ART

Generally, a display device includes a display area and a non-display area. The non-display area is located outside the display area and may be referred to as a peripheral area. The display area may include display elements such as pixels for displaying an image to the outside, and the non-display area may include a circuit for effectuating the display of the image such as a driving circuit. For example, an organic light-emitting display device includes an organic light-emitting diode as a display element, and a driving circuit of the organic light-emitting display device includes a thin film transistor, a storage capacitor, and a plurality of wirings.

Recently, display devices have become thinner and lightweight, and thus, their range of use has increased. Accordingly, research is being conducted into reducing an area of a non-display area of the display device.

SUMMARY

An exemplary embodiment of the inventive concept provides a display device including: a substrate including a display area and a peripheral area adjacent to the display area; a plurality of data lines extending in a first direction in the display area; a fan-out unit arranged in the peripheral area and connected to the plurality of data lines; a first signal line arranged in the peripheral area; and a common power supply line arranged in the peripheral area and overlapping the fan-out unit.

The first signal line may overlap the fan-out unit.

The display device may further include a test circuit located in the peripheral area, wherein the first signal line is connected to the test circuit.

The test circuit may be located opposite the fan-out unit with the display area therebetween.

The display device may further include: a driving circuit located in the peripheral area; and a second signal line connected to the driving circuit, wherein the first signal line is located between the second signal line and the common power supply line.

The first signal line and the second signal line may be arranged on different layers.

The first signal line and the second signal line may include different materials.

The second signal line and the common power supply line may include the same material.

The display area may have a non-quadrangular shape.

The display device may further include a data distribution circuit arranged in the peripheral area between the display area and the common power supply line and electrically connected to the plurality of datalines.

The data distribution circuit may partially circle an outer side of the display area.

The data distribution circuit may be located between the display area and the first signal line.

The data distribution circuit may be symmetrical to the test circuit about an axis crossing the display area therebetween.

The display device may further include: a pixel circuit and a display element, the pixel circuit being arranged in the display area and including a thin film transistor and a storage capacitor, wherein the display element is electrically connected to the pixel circuit, wherein the display element includes a first electrode, a second electrode, and an intermediate layer between the first electrode and the second electrode, the thin film transistor includes a semiconductor layer, a gate electrode, and an electrode layer, wherein the gate electrode overlaps the semiconductor layer, and the electrode layer is connected to the semiconductor layer, and the storage capacitor includes a bottom electrode overlapping a top electrode, the bottom electrode including the same material as that of the gate electrode.

The second signal line may include the same material as that of the electrode layer.

The common power supply line may include the same material as that of the electrode layer.

The fan-out unit may include a plurality of first wirings and a plurality of second wirings that are separated from each other and are alternately arranged, wherein the plurality of first wirings include the same material as that of the gate electrode, and the plurality of second wirings include the same material as that of the top electrode.

The display device may further include a connection electrode arranged between the electrode layer and the pixel electrode to electrically connect the electrode layer to the pixel electrode, wherein the first signal line includes the same material as that of the connection electrode.

The display area may be circular, and the first signal line may include a first sub-signal line and a second sub-signal line, wherein the first sub-signal line semi-circumnavigates a first side of the display area, and the second sub-signal line semi-circumnavigates a second side of the display area.

The first sub-signal line and the second sub-signal line may be arranged on different layers and be electrically connected to each other through a contact hole formed in an insulating layer therebetween.

The first sub-signal line may include the same material as that of the connection electrode, and the second sub-signal line may include the same material as that of the electrode layer.

The common power supply line may surround an outer side of the display area and has one open side.

An exemplary embodiment of the inventive concept provides a display device including: a substrate including a display area and a peripheral area outside the display area, wherein the display area has a non-quadrangular shape; a driving circuit arranged in the peripheral area; a fan-out unit arranged in the peripheral area between the display area and the driving circuit; a test circuit arranged in the peripheral area; a test line arranged in the peripheral area around the display area and connected to the test circuit; and a common power supply line arranged in the peripheral area adjacent to the test line and partially overlapping the fan-out unit.

A portion of the test line may overlap the fan-out unit.

The common power supply line may circumnavigate an outer side of the display area.

The test line may circumnavigate an outer side of the display area.

An exemplary embodiment of the inventive concept provides a display device including: a substrate including a display area and a peripheral area surrounding the display area; a fan-out unit arranged in the peripheral area and connected to data lines extending from the display area; a test line arranged in the peripheral area and circumnavigating the display area; and a power supply line arranged in the peripheral area and overlapping the fan-out unit.

The display device may further include a data driving circuit connected to the fan-out unit, wherein the fan-out unit is disposed between the data driving circuit and the test line.

The test line may be disposed between the power supply line and a scan driving circuit.

The test line may be disposed between the power supply line and a data distribution circuit.

BRIEF DESCRIPTION OF THE DRAWINGS

The above and other features of the inventive concept will be more apparent by describing in detail exemplary embodiments thereof with reference to the accompanying drawings, in which.

DETAILED DESCRIPTION OF THE EMBODIMENTS

Figure 1:
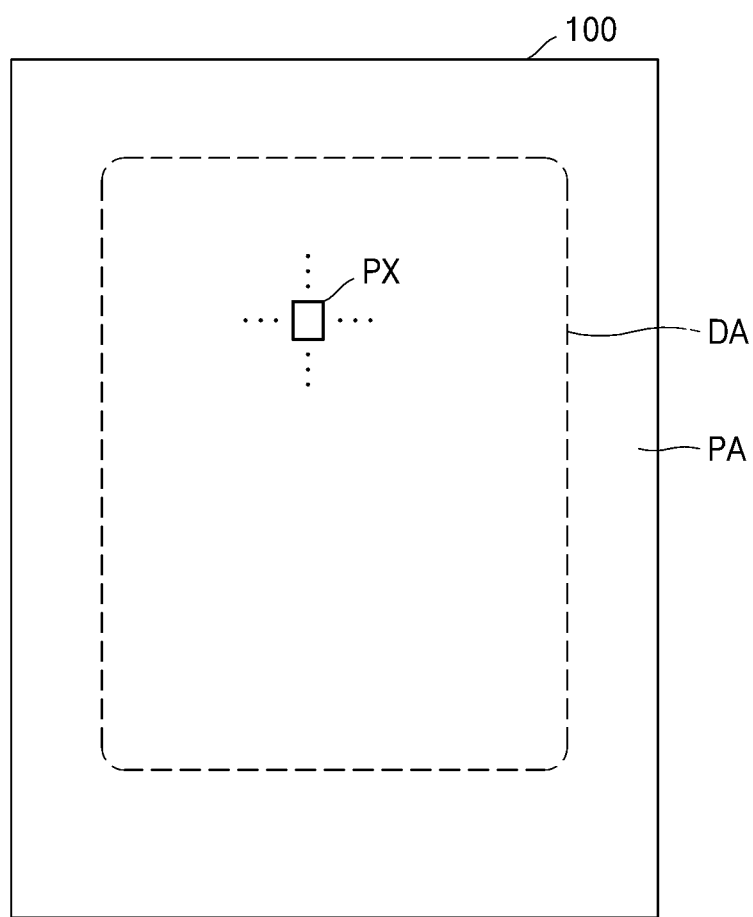
FIGS. 1 and 2 are plan views of a display device according to exemplary embodiments of the inventive concept.

Exemplary embodiments of the inventive concept will now be described with reference to the accompanying drawings. The inventive concept may, however, be embodied in many different forms and should not be construed as being limited to the embodiments set forth herein.

In the drawings, the same reference numerals may denote the same or corresponding elements.

As used herein, the singular forms "a," "an," and "the" are intended to include the plural forms as well, unless the context clearly indicates otherwise.

It will be understood that when a layer, region, or component is referred to as being "formed on," another layer, region, or component, it can be directly formed on the other layer, region, or component, or, intervening layers, regions, or components may be present.

Sizes of elements in the drawings may be exaggerated for convenience of explanation.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component and/or may be "indirectly connected" to the other layer, region, or component with another layer, region, or component interposed therebetween. For example, it will be understood that when a layer, region, or component is referred to as being "electrically connected" to another layer, region, or component, it may be "directly electrically connected" to the other layer, region, or component and/or may be "indirectly electrically connected" to other layer, region, or component with another layer, region, or component interposed therebetween.

In the following examples, the x-axis, the y-axis and the z-axis are not limited to three axes of the rectangular coordinate system. For example, the x-axis, the y-axis, and the z-axis may be perpendicular to one another, or may represent different directions that are not perpendicular to one another.

Figure 2:
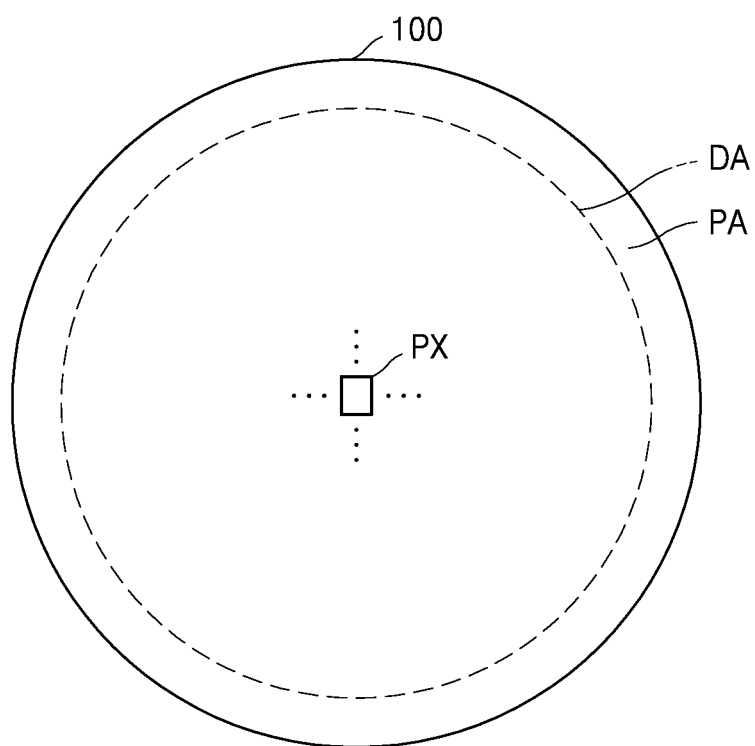

FIGS. 1 and 2 are plan views of a display device according to exemplary embodiments of the inventive concept.

A substrate 100 may be divided into a display area DA on which an image is displayed and a peripheral area PA outside the display area DA. For example, the peripheral area PA may surround the display area DA.

The substrate 100 may include various materials such as glass, metal, or plastic. In an exemplary embodiment of the inventive concept, the substrate 100 may include a flexible material. In this case, the substrate 100 can be warped, bent, or rolled. The substrate 100 including a flexible material may include ultra-thin glass, metal, or plastic.

Pixels PX may be arranged in the display area DA of the substrate 100. For example, the pixels PX may include various display elements such as an organic light-emitting diode (OLED). The pixel PX shown in FIG. 1 is provided as a plurality of pixels PX. The plurality of pixels PX may be arranged in various shapes such as a stripe, a pentile, and a mosaic to display an image.

In a plan view, the display area DA may be provided in a rectangular shape as in FIG. 1 or a circular shape as in FIG. 2. In another exemplary embodiment of the inventive concept, the display area DA may be provided in a polygonal shape such as a triangle, a pentagon, or a hexagon, an elliptical shape, or an atypical shape.

The peripheral area PA of the substrate 100 may be an area in which an image is not displayed. For example, the peripheral area PA may be arranged outside the display area DA. Various wirings, a printed circuit board, or pads on which a driver integrated circuit (IC) chip is attached may be located in the peripheral area PA. The various wirings may be used to transfer an electric signal applied to the display area DA.

Hereinafter, though the display device according to an exemplary embodiment of the inventive concept is described as an organic light-emitting display, this is merely exemplary and the display device is not limited thereto. For example, in another exemplary embodiment of the inventive concept, the display device may include an inorganic light-emitting display or a quantum dot light-emitting display. Here, an emission layer of a display element of the display device may include an organic material, an inorganic material, quantum dots, an organic material and quantum dots, or an inorganic material and quantum dots.

Figure 3:
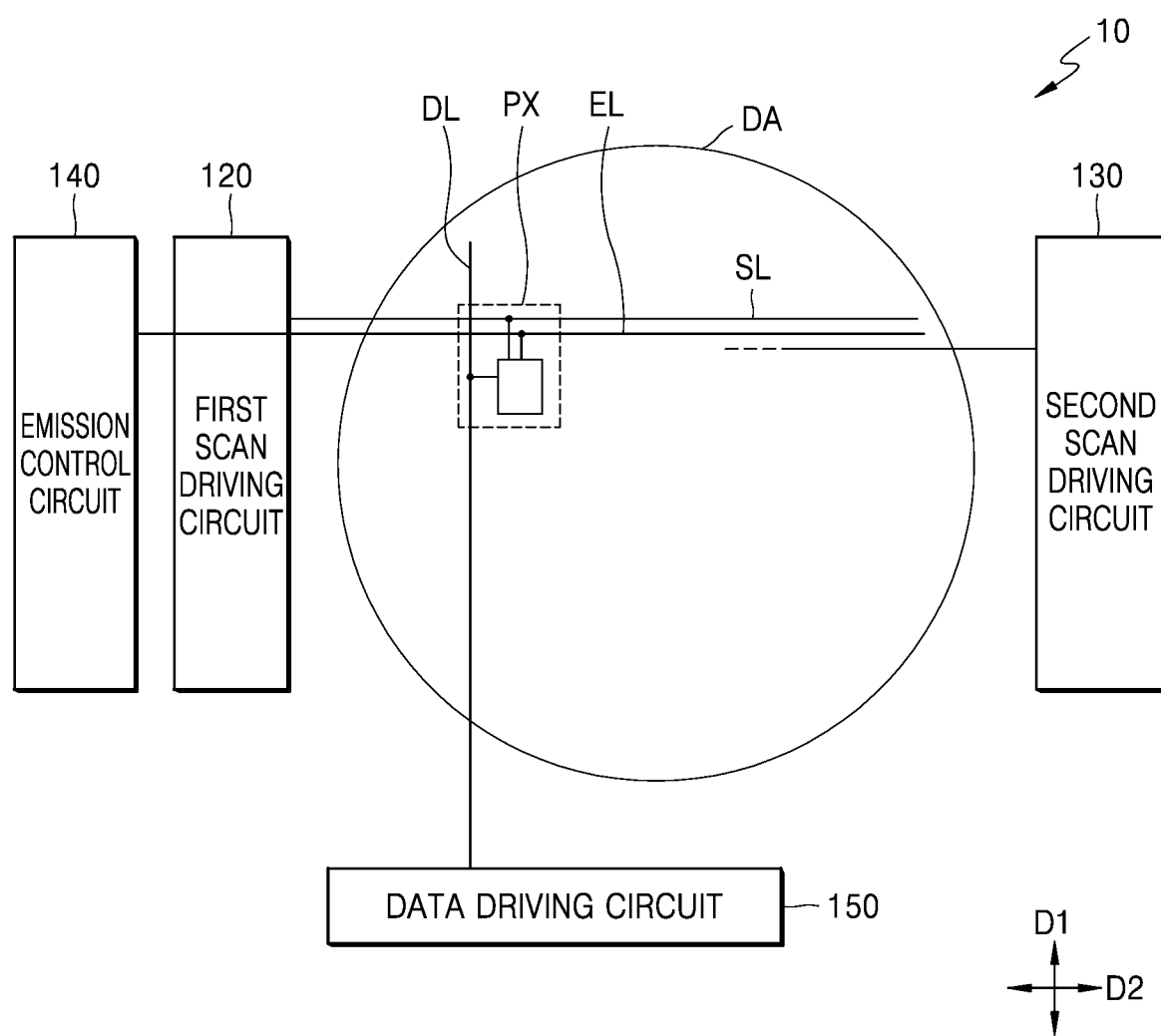
FIG. 3 is a configuration view of a display device according to an exemplary embodiment of the inventive concept.
Figure 4:
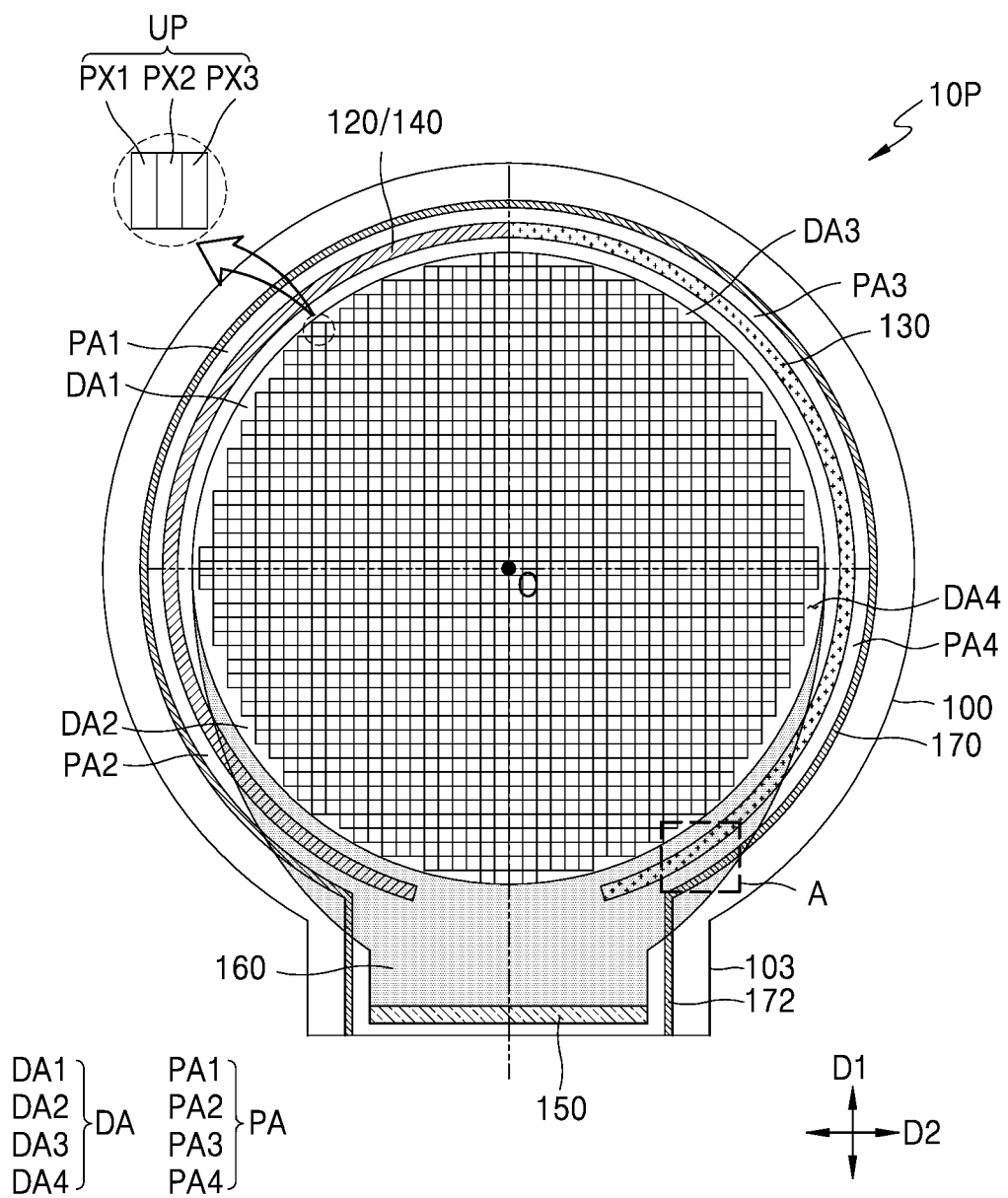
FIG. 4 is a plan view of a display panel of a display device shown in FIG. 3.

FIG. 3 is a configuration view of a display device 10 according to an exemplary embodiment of the inventive concept, and FIG. 4 is a plan view of a display panel of the display device 10 shown in FIG. 3. FIGS. 3 and 4 show the display device 10 in which the display area DA has a circular shape as an example.

Referring to FIGS. 3 and 4, the display device 10 may include the display panel, and the display panel may include the substrate 100. The substrate 100 may include the display area DA and the peripheral area PA, which is a non-display area, outside the display area DA.

The substrate 100 may have a non-quadrangular shape. The non-quadrangular shape may be, for example, a circle, an ellipse, a polygon in which a portion thereof is circular, or a polygon except for a quadrangle.

The substrate 100 may have a shape corresponding to the shape of the display area DA. FIG. 4 shows an example in which the substrate 100 has a circular shape and the display area DA has a circular shape corresponding to the shape of the substrate 100. Around a center O of the display area DA, the display area DA may include a first display area DA1 on the upper left, a second display area DA2 on the lower left, a third display area DA3 on the upper right, and a fourth display area DA4 on the lower right. The peripheral area PA may include a first peripheral area PA1, which is a periphery of an edge of the first display area DA1, a second peripheral area PA2, which is a periphery of an edge of the second display area DA2, a third peripheral area PA3, which is a periphery of an edge of the third display area DA3, and a fourth peripheral area PA4, which is a periphery of an edge of the fourth display area DA4.

The plurality of pixels PX and signal lines may be located in the display area DA. The signal lines may apply an electric signal to the plurality of pixels PX. The plurality of pixels PX may include a first pixel PX1, a second pixel PX2, and a third pixel PX3, the first pixel PX1 emitting light of a first color, the second pixel PX2 emitting light of a second color, and the third pixel PX3 emitting light of a third color. As shown in FIG. 4, unit pixels UP including the first pixel PX1, the second pixel PX2, and the third pixel PX3 may be repeatedly arranged in a first direction D1 and a second direction D2 in the display area DA. The unit pixels UP may be arranged to correspond to the shape of the display area DA. For example, row and column arrangements of the unit pixels UP arranged along an edge of the display area DA may have a step difference. In other words, the unit pixels UP arranged along the edge of the display area DA may form a zigzag shape.

The signal lines may include a plurality of data lines DL, a plurality of scan lines SL, and a plurality of emission control lines EL. The signal lines may apply electric signals to the pixels PX. Each of the plurality of data lines DL each may extend in the first direction D1. Each of the plurality of scan lines SL and the plurality of emission control lines EL may extend in the second direction D2. The scan lines SL and the emission control lines EL may intersect the data lines DL.

Each of the pixels PX may be connected to a corresponding scan line SL among the plurality of scan lines SL, a corresponding emission control line EL among the plurality of emission control lines EL, and a corresponding data line DL among the plurality of data lines DL.

The peripheral area PA is an area in which the pixels PX are not arranged and driving circuits may be located. A driving circuit may supply a signal for driving the pixels PX. The driving circuits may include a first scan driving circuit 120, a second scan driving circuit 130, an emission control circuit 140, and a data driving circuit 150.

The first scan driving circuit 120 may output a first scan signal to the first scan lines of the scan lines SL and the second scan driving circuit 130 may output a second scan signal to the second scan lines of the scan lines SL. The emission control circuit 140 may output an emission control signal to the emission control lines EL. The data driving circuit 150 may output a data signal to the data lines DL.

The first scan driving circuit 120, the second scan driving circuit 130, and the emission control circuit 140 may be arranged in the peripheral area PA along the edge of the display area DA, in other words, the periphery of the display area DA. As shown in FIGS. 3 and 4, the first scan driving circuit 120 and the second scan driving circuit 130 may be respectively arranged on two opposite sides of the display area DA, and the emission control circuit 140 may be located on only one side of the display area DA. For example, the first scan driving circuit 120 and the emission control circuit 140 may be arranged in the first peripheral area PA1 and the second peripheral area PA2. The second scan driving circuit 130 may be arranged in the third peripheral area PA3 and the fourth peripheral area PA4.

The data driving circuit 150 may be directly arranged on a protrusion area 103 extending from the substrate 100 by using a chip-on-glass (COG) method or a chip-on-plastic (COP) method. In another exemplary embodiment of the inventive concept, the data driving circuit 150 may be arranged on a film electrically connected to pads arranged in the peripheral area PA of the substrate 100.

A fan-out unit 160 may be arranged in the peripheral area PA between the display area DA and the data driving circuit 150. The fan-out unit 160 may be connected to the plurality of data lines DL. In other words, the plurality of data lines DL may extend beyond the display area DA and be connected to the data driving circuit 150. The plurality of data lines DL extending from the display area DA to the data driving circuit 150 may constitute the fan-out unit 160. The fan-out unit 160 may include the plurality of data lines DL that extend thereon, conductive lines formed on different layers, or conductive lines that are electrically connected to the plurality of data lines DL through contact holes. As shown in FIG. 4, the fan-out unit 160 may be arranged on only one side of the display area DA.

Figure 13:
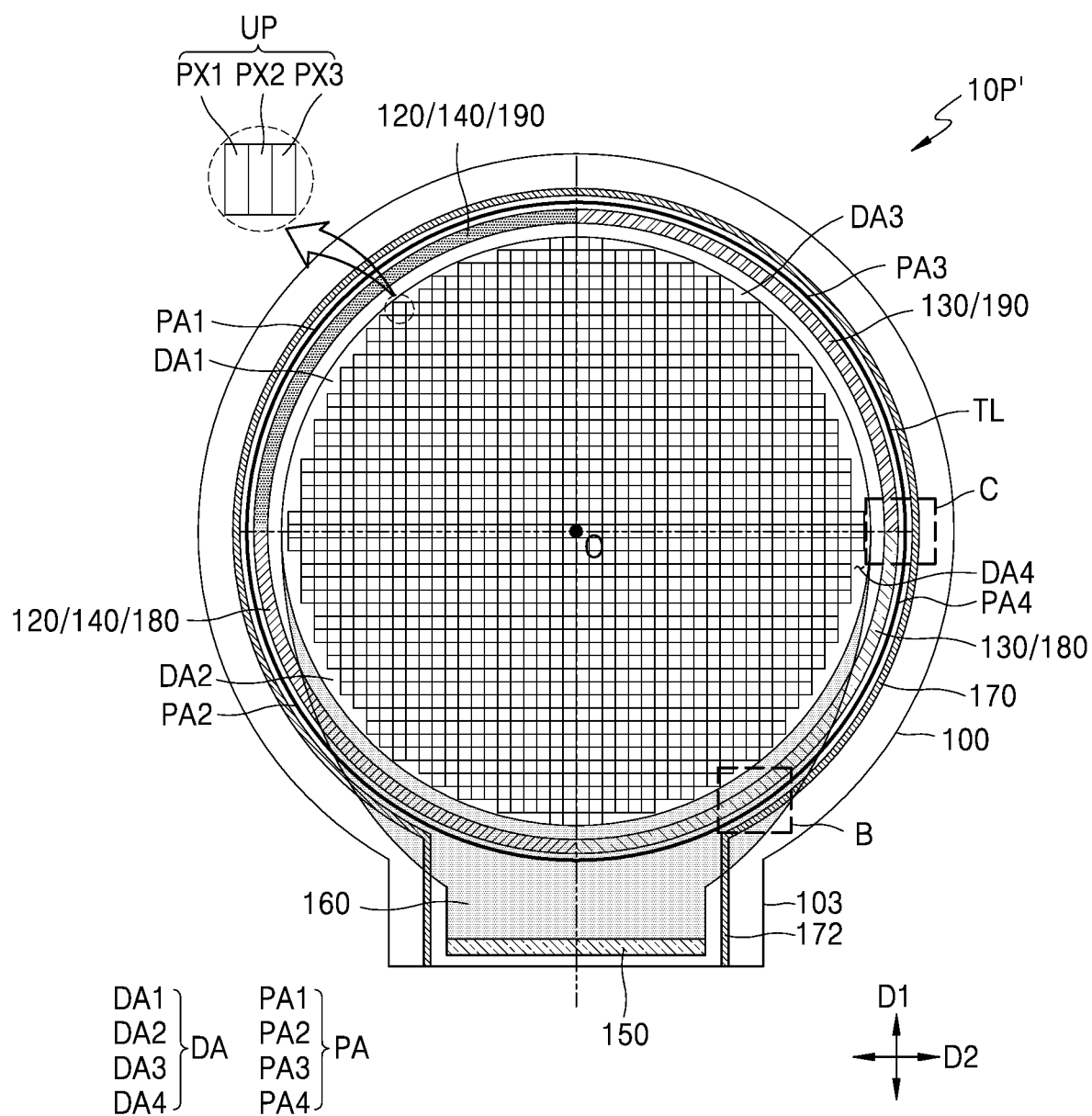
FIG. 13 is a plan view of a display panel of a display device shown in FIG. 12.

A common power supply line 170 may be located outside the first scan driving circuit 120, the second scan driving circuit 130, and the emission control circuit 140. For example, the first scan driving circuit 120, the second scan driving circuit 130, and the emission control circuit 140 may be disposed between the common power supply line 170 and the display area DA. A driving power supply line may transfer a first driving power voltage ELVDD to each pixel PX, and the common power supply line 170 may transfer a second power voltage (also referred to as a common voltage ELVSS) to each pixel PX. In an exemplary embodiment of the inventive concept, in the case where the display area DA is circular, the common power supply line 170 may be provided in a loop shape having one open side as shown in FIGS. 4 and 13. In another exemplary embodiment of the inventive concept, the common power supply line 170 may be provided in a closed curve shape that circumnavigates an outer side of the display area DA. The common power supply line 170 may include a connection line 172 extending to the protrusion area 103 of the substrate 100. The connection line 172 may extend up to the edge of the substrate 100, and a pad may be provided at an end portion of the connection line 172. The connection line 172 may extend to the outside of the data driving circuit 150.

In the display device according to the present embodiment, the fan-out unit 160 may at least partially overlap the common power supply line 170. Since the fan-out unit 160 overlaps the common power supply line 170, the peripheral area PA outside the display area DA may be reduced. This is described in detail with reference to FIGS. 10 and 11.

Figure 5:
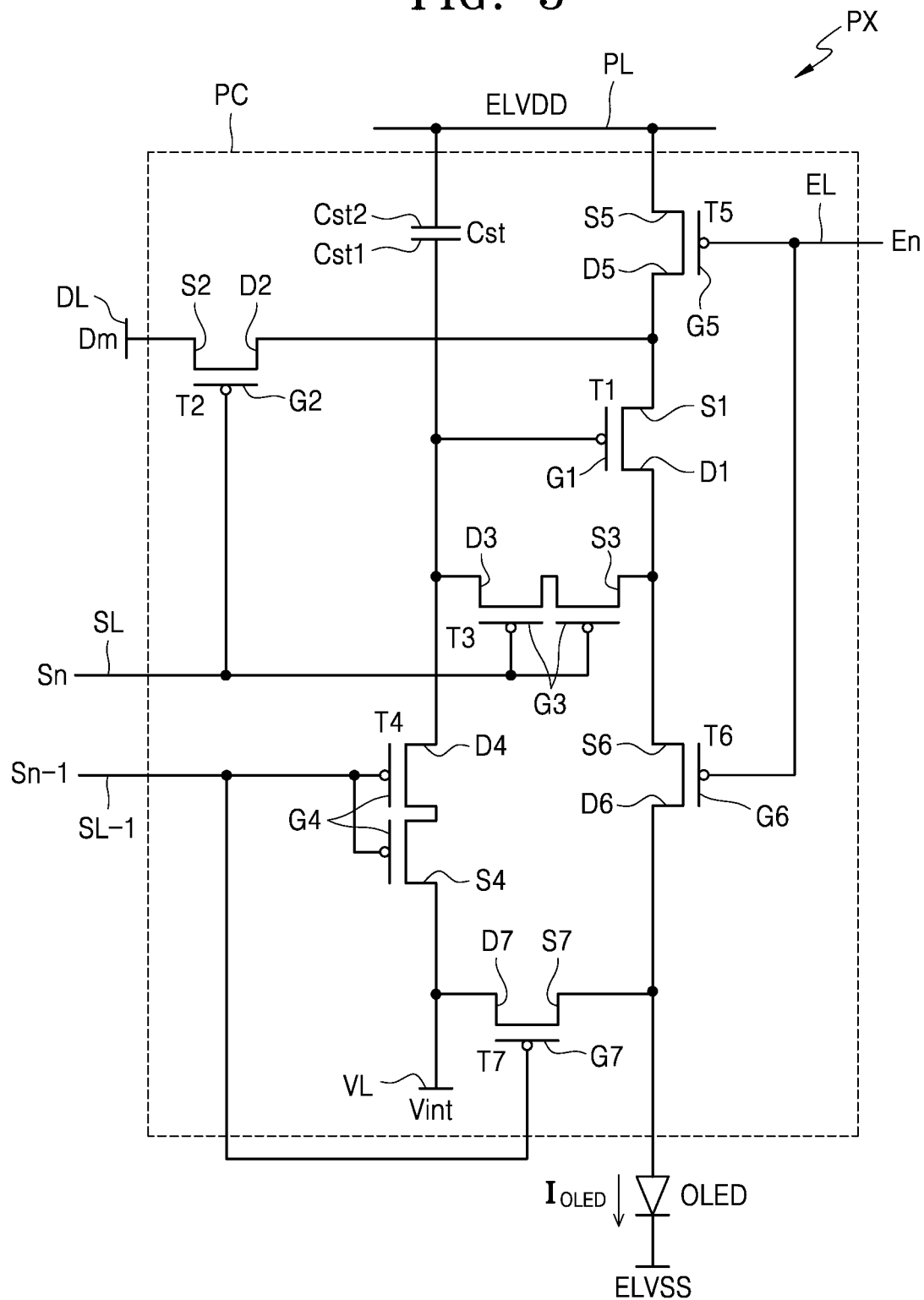
FIG. 5 is an equivalent circuit diagram of a pixel according to an exemplary embodiment of the inventive concept.
Figure 6:
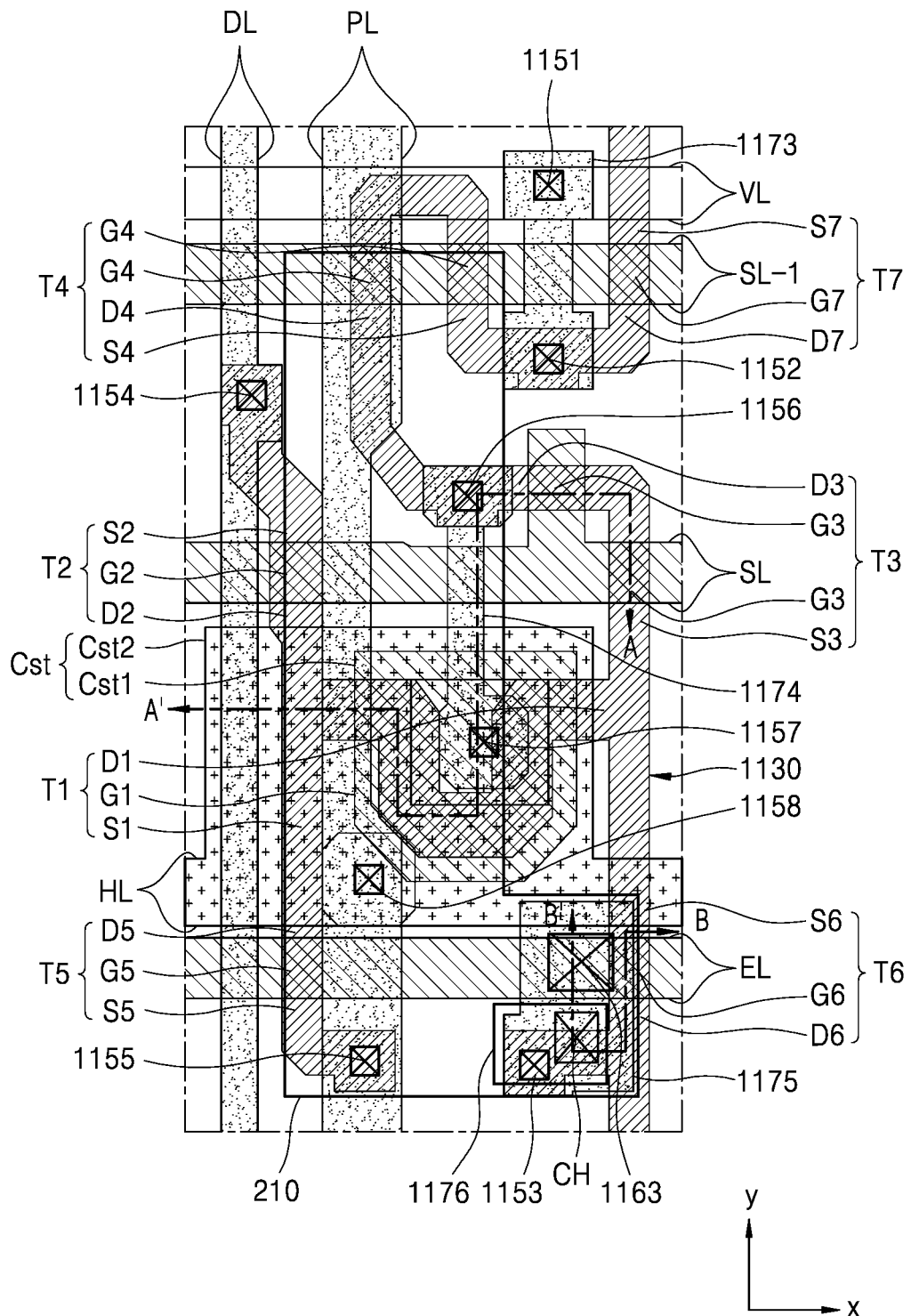
FIG. 6 is a circuit arrangement view of FIG. 5.
Figure 7:
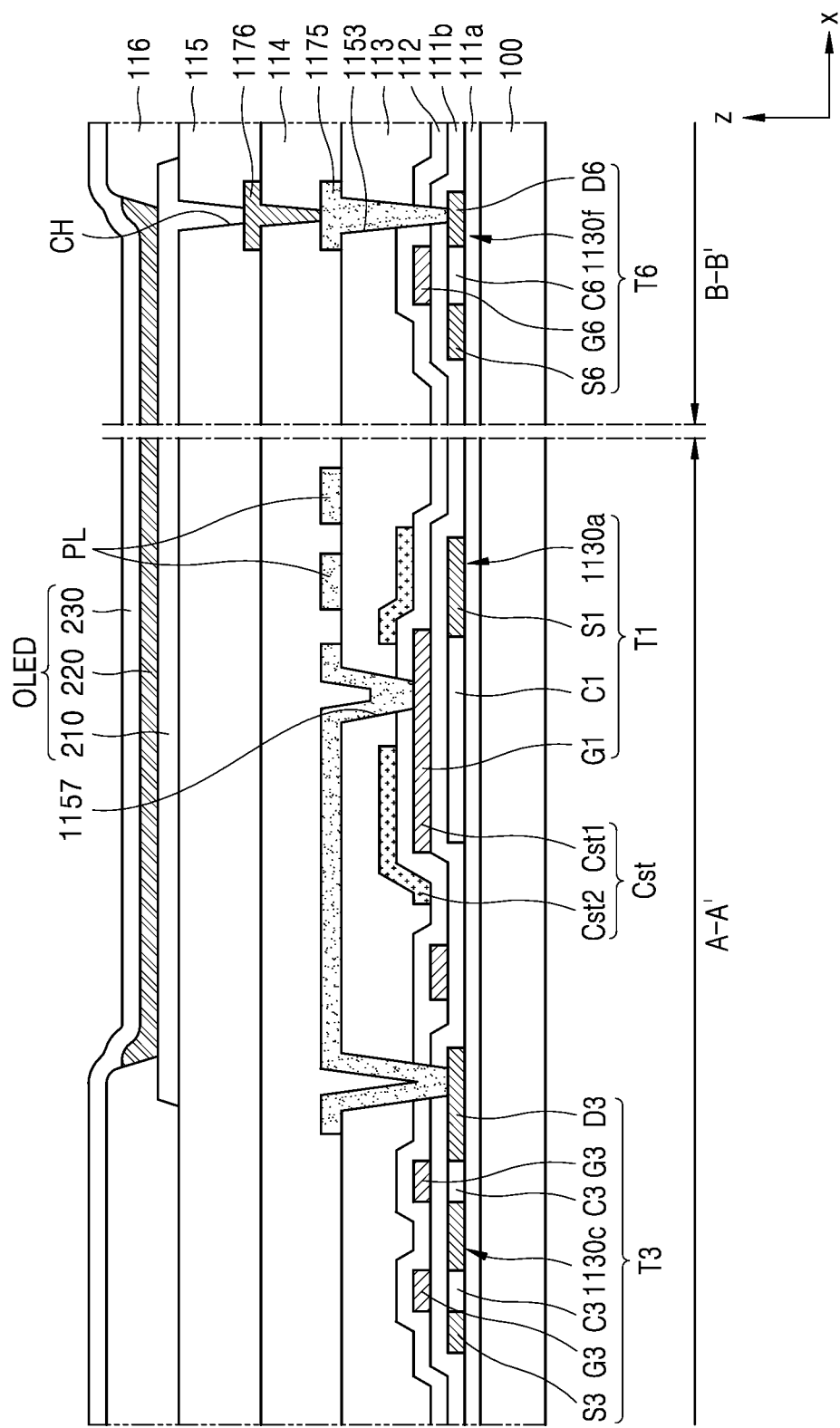
FIG. 7 is a cross-sectional view of a portion of FIG. 6.

FIG. 5 is an equivalent circuit diagram of a pixel according to an exemplary embodiment of the inventive concept, FIG. 6 is a circuit arrangement view of FIG. 5, and FIG. 7 is a cross-sectional view of a portion of FIG. 6. FIG. 7 corresponds to a cross section taken along lines A-A' and B-B' of FIG. 6.

Referring to FIGS. 5 to 7, a pixel PX includes a pixel circuit PC and an organic light-emitting diode OLED connected to the pixel circuit PC. The pixel circuit PC may include a plurality of thin film transistors and a storage capacitor Cst. The thin film transistors and the storage capacitor Cst may be connected to signal lines SL, SL−1, EL, and DL, an initialization voltage line VL, and a driving voltage line PL.

Though it is shown in FIG. 5 that each pixel PX is connected to the signal lines SL, SL−1, EL, and DL, the initialization voltage line VL, and the driving voltage line PL, the inventive concept is not limited thereto. In another exemplary embodiment of the inventive concept, at least one of the signal lines SL, SL−1, EL, and DL, the initialization voltage line VL, and the driving voltage line PL may be shared by pixels that neighbor each other.

The plurality of thin film transistors may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7.

The signal lines include a scan line SL, a previous scan line SL−1, an emission control line EL, and a data line DL. The scan line SL transfers a scan signal Sn, the previous scan line SL−1 transfers a previous scan signal Sn−1 to the first initialization thin film transistor T4 and the second initialization thin film transistor T7, the emission control line EL transfers an emission control signal En to the operation control thin film transistor T5 and the emission control thin film transistor T6. The signal lines further include the data line DL intersecting with the scan line SL, the data line DL for transferring a data signal Dm. The driving voltage line PL transfers the first driving voltage ELVDD to the driving thin film transistor T1, and the initialization voltage line VL transfers an initialization voltage Vint for initializing the driving thin film transistor T1 and a pixel electrode.

A driving gate electrode G1 of the driving thin film transistor T1 is connected to a first storage capacitor plate Cst1 of the storage capacitor Cst, a driving source electrode S1 of the driving thin film transistor T1 is connected to the driving voltage line PL through the operation control thin film transistor T5, and a driving drain electrode D1 of the driving thin film transistor T1 is electrically connected to the pixel electrode of an organic light-emitting diode OLED through the emission control thin film transistor T6. The pixel electrode of the organic light-emitting diode OLED may be referred to as a first electrode of the organic light-emitting diode OLED. The driving thin film transistor T1 receives a data signal Dm according to a switching operation of the switching thin film transistor T2 and supplies a driving current $I_{OLED}$ to the organic light-emitting diode OLED.

A switching gate electrode G2 of the switching thin film transistor T2 is connected to the scan line SL, a switching source electrode S2 of the switching thin film transistor T2 is connected to the data line DL, and a switching drain electrode D2 of the switching thin film transistor T2 is connected to the driving source electrode S1 of the driving thin film transistor T1 and also connected to the driving voltage line PL through the operation control thin film transistor T5. The switching thin film transistor T2 is turned on in response to a scan signal Sn transferred through the scan line SL and performs a switching operation of transferring a data signal Dm transferred through the data line DL to the driving source electrode S1 of the driving thin film transistor T1.

A compensation gate electrode G3 of the compensation thin film transistor T3 is connected to the scan line SL, a compensation source electrode S3 of the compensation thin film transistor T3 is connected to the driving drain electrode D1 of the driving thin film transistor T1 and also connected to the pixel electrode of the organic light-emitting diode OLED through the emission control thin film transistor T6, and a compensation drain electrode D3 of the compensation thin film transistor T3 is connected to the first storage capacitor plate Cst1 of the storage capacitor Cst, a first initialization drain electrode D4 of the first initialization thin film transistor T4, and the driving gate electrode G1 of the driving thin film transistor T1. The compensation thin film transistor T3 is turned on in response to a scan signal Sn transferred through the scan line SL and diode-connects the driving thin film transistor T1 by electrically connecting the driving gate electrode G1 of the driving thin film transistor T1 to the driving drain electrode D1 of the driving thin film transistor T1.

A first initialization gate electrode G4 of the first initialization thin film transistor T4 is connected to the previous scan line SL−1, a first initialization source electrode S4 of the first initialization thin film transistor T4 is connected to a second initialization drain electrode D7 of the second initialization thin film transistor T7 and the initialization voltage line VL, and a first initialization drain electrode D4 of the first initialization thin film transistor T4 is connected to the first storage capacitor plate Cst1 of the storage capacitor Cst, the compensation drain electrode D3 of the compensation thin film transistor T3, and the driving gate electrode G1 of the driving thin film transistor T1. The first initialization thin film transistor T4 is turned on in response to a previous scan signal Sn−1 transferred through the previous scan line SL−1 and performs an initialization operation of transferring an initialization voltage Vint to the driving gate electrode G1 of the driving thin film transistor T1, thereby initializing a voltage of the driving gate electrode G1 of the driving thin film transistor T1.

An operation control gate electrode G5 of the operation control thin film transistor T5 is connected to the emission control line EL, an operation control source electrode S5 of the operation control thin film transistor T5 is connected to the driving voltage line PL, and an operation control drain electrode D5 of the operation control thin film transistor T5 is connected to the driving source electrode S1 of the driving thin film transistor T1 and the switching drain electrode D2 of the switching thin film transistor T2.

An emission control gate electrode G6 of the emission control thin film transistor T6 is connected to the emission control line EL, an emission control source electrode S6 of the emission control thin film transistor T6 is connected to the driving drain electrode D1 of the driving thin film transistor T1 and the compensation source electrode S3 of the compensation thin film transistor T3, and an emission control drain electrode D6 of the emission control thin film transistor T6 is connected to the second initialization source electrode S7 of the second initialization thin film transistor T7 and the pixel electrode of the organic light-emitting diode OLED.

The operation control thin film transistor T5 and the emission control thin film transistor T6 are simultaneously turned on in response to an emission control signal En transferred through the emission control line EL to allow the first driving voltage ELVDD to be transferred to the organic light-emitting diode OLED and thus the driving current $I_{OLED}$ to flow through the organic light-emitting diode OLED.

A second initialization gate electrode G7 of the second initialization thin film transistor T7 is connected to the previous scan line SL−1, the second initialization source electrode S7 of the second initialization thin film transistor T7 is connected to the emission control drain electrode D6 of the emission control thin film transistor T6 and the pixel electrode of the organic light-emitting diode OLED, and the second initialization drain electrode D7 of the second initialization thin film transistor T7 is connected to the first initialization source electrode S4 of the first initialization thin film transistor T4 and the initialization voltage line VL. The second initialization thin film transistor T7 is turned on in response to a previous scan signal Sn−1 transferred through the previous scan line SL−1 and initializes the pixel electrode of the organic light-emitting diode OLED.

Though FIG. 5 shows the case where the first initialization thin film transistor T4 and the second initialization thin film transistor T7 are connected to the previous scan line SL−1, the inventive concept is not limited thereto. In another exemplary embodiment of the inventive concept, the first initialization thin film transistor T4 may be connected to the previous scan line SL−1 and driven in response to a previous scan signal Sn−1, and the second initialization thin film transistor T7 may be connected to a separate signal line (for example, the next scan line Sn+1) and driven in response to a signal transferred through the separate signal line.

A second storage capacitor plate Cst2 of the storage capacitor Cst is connected to the driving voltage line PL, and a second electrode of the organic light-emitting diode OLED is connected to the common voltage ELVSS. Therefore, the organic light-emitting diode OLED may receive the driving current $I_{OLED}$ from the driving thin film transistor T1 and emit light to thereby display an image.

Though it is shown in FIG. 5 that the compensation thin film transistor T3 and the first initialization thin film transistor T4 each have a dual gate electrode, the compensation thin film transistor T3 and the first initialization thin film transistor T4 each may have one gate electrode.

Referring to FIGS. 6 and 7, the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 are arranged along a semiconductor layer 1130. A buffer layer 111a is arranged under the semiconductor layer 1130, the buffer layer 111a including an inorganic material such as $SiO_x$, SiN, and SiON.

Portions of the semiconductor layer 1130 respectively correspond to semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7. In other words, the semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 may be connected to each other and bent in various shapes. Furthermore, these semiconductor layers may be disposed on the same layer or at the same level as each other.

FIG. 7 shows a driving semiconductor layer 1130a of the driving thin film transistor T1, a compensation semiconductor layer 1130c of the compensation thin film transistor T3, and an emission control semiconductor layer 1130f of the emission control thin film transistor T6 corresponding to certain portions of the semiconductor layer 1130.

The semiconductor layer 1130 includes a channel region, a source region, and a drain region, the source region and the drain region being on two opposite sides of the channel region. It may be understood that the source region and the drain region are a source electrode and a drain electrode of a thin film transistor corresponding thereto. Hereinafter, for convenience of description, a source region and a drain region are respectively referred to as a source electrode and a drain electrode.

The driving thin film transistor T1 includes the driving gate electrode G1, the driving source electrode S1, and the driving drain electrode D1, the driving gate electrode G1 overlapping a driving channel region C1, and the driving source electrode S1 and the driving drain electrode D1 being on opposite sides of the driving channel region C1. The driving channel C1 region overlapping the driving gate electrode G1 may form a long channel inside a narrow space by having a bent shape such as an omega shape. In the case where the driving channel region is long, a driving range of a gate voltage widens and gradation of light emitted from an organic light-emitting diode OLED may be better controlled, and a display quality may be improved.

The switching thin film transistor T2 includes the switching gate electrode G2, the switching source electrode S2, and the switching drain electrode D2, the switching gate electrode G2 overlapping a switching channel region, and the switching source electrode S2 and the switching drain electrode D2 being on opposite sides of the switching channel region. The switching drain electrode D2 may be connected to the driving source electrode S1.

The compensation thin film transistor T3 is a dual thin film transistor and may include the compensation gate electrodes G3, the compensation source electrode S3, and the compensation drain electrode D3, the compensation gate electrodes G3 overlapping two compensation channel regions C3, and the compensation source electrode S3 and the compensation drain electrode D3 being on opposite sides of the compensation channel regions C3. The compensation thin film transistor T3 may be connected to the driving gate electrode G1 of the driving thin film transistor T1 through a node connection line 1174 described below.

The first initialization thin film transistor T4 is a dual thin film transistor and may include the first initialization gate electrodes G4, the first initialization source electrode S4, and the first initialization drain electrode D4, the first initialization gate electrodes G4 overlapping two first initialization channel regions, and the first initialization source electrode S4 and the first initialization drain electrode D4 being on opposite sides of the first initialization channel regions.

The operation control thin film transistor T5 may include the operation control gate electrode G5, the operation control source electrode S5, and the operation control drain electrode D5, the operation control gate electrode G5 overlapping an operation control channel region, and the operation control source electrode S5 and the operation control drain electrode D5 being on opposite sides of the operation control channel region. The operation control drain electrode D5 may be connected to the driving source electrode S1.

The emission control thin film transistor T6 may include the emission control gate electrode G6, the emission control source electrode S6, and the emission control drain electrode D6, the emission control gate electrode G6 overlapping an emission control channel region C6, and the emission control source electrode S6 and the emission control drain electrode D6 being on opposite sides of the emission control channel region C6. The emission control source electrode S6 may be connected to the driving drain electrode D1. The emission control drain electrode D6 may be connected to another layer through a contact hole.

The second initialization thin film transistor T7 may include the second initialization gate electrode G7, the second initialization source electrode S7, and the second initialization drain electrode D7, the second initialization gate electrode G7 overlapping a second initialization channel region, and the second initialization source electrode S7 and the second initialization drain electrode D7 being on opposite sides of the second initialization channel region.

The above-described thin film transistors T1 to T7 may be connected to the signal lines SL, SL-1, EL, and DL, the initialization voltage line VL, and the driving voltage line PL.

A first insulating layer 111b (see FIG. 7) may be arranged on the semiconductor layer 1130. The scan line SL, the previous scan line SL-1, the emission control line EL, and the driving gate electrode G1 may be arranged on the first insulating layer 111b. The first insulating layer 111b may include an inorganic material such as silicon oxide, silicon nitride, and silicon oxynitride. The scan line SL, the previous scan line SL-1, the emission control line EL, and the driving gate electrode G1 may include a metal such as molybdenum (Mo), aluminum (Al), copper (Cu), titanium (Ti), and an alloy thereof.

The scan line SL may extend in an x-direction. Some portions of the scan line SL may respectively correspond to the switching and compensation gate electrodes G2 and G3. For example, portions of the scan line SL that overlap the switching and compensation thin film transistors T2 and T3 may be the switching and compensation gate electrodes G2 and G3, respectively.

The previous scan line SL-1 may extend in the x-direction and some portions of the previous scan line SL-1 may respectively correspond to the first and second initialization gate electrodes G4 and G7. For example, portions of the previous scan line SL-1 that overlap the channel regions of the first and second initialization thin film transistors T4 and T7 may be the first and second initialization gate electrodes G4 and G7, respectively.

The emission control line EL may extend in the x-direction. Some portions of the emission control line EL may respectively correspond to the operation control and emission control gate electrodes G5 and G6. For example, portions of the emission control line EL that overlap the channel regions of the operation control and emission control thin film transistors T6 and T7 may be the operation control and emission control gate electrodes G5 and G6, respectively.

The driving gate electrode G1 is a floating electrode and may be connected to the compensation thin film transistor T3 through the node connection line 1174.

The initialization voltage line VL may extend in the x-direction. The initialization voltage line VL may be connected to the first and second initialization thin film transistors T4 and T7 through an initialization connection line 1173 described below.

In FIG. 6, the initialization voltage line VL is arranged on the same layer on which a contact metal 1176 is arranged and may be arranged on a fourth insulating layer 114 of FIG. 7. In this case, as shown in FIG. 7, a pixel electrode 210 is arranged on the fourth insulating layer 114.

An electrode voltage line HL may be arranged over the scan line SL, the previous scan line SL-1, the emission control line EL, and the driving gate electrode G1 with a second insulating layer 112 (see FIG. 7) including an inorganic material therebetween.

As shown in FIG. 6, the electrode voltage line HL may extend in the x-direction to intersect with the data line DL and the driving voltage line PL. A portion of the electrode voltage line HL may cover at least a portion of the driving gate electrode G1 and constitute the storage capacitor Cst with the driving gate electrode G1. For example, the driving gate electrode G1 may serve as the first storage capacitor plate Cst1 (in other words, a bottom electrode) of the storage capacitor Cst, and a portion of the electrode voltage line HL may serve as the second storage capacitor plate Cst2 (in other words, a top electrode) of the storage capacitor Cst.

The driving voltage line PL and the second storage capacitor plate Cst2 are electrically connected to the driving voltage line PL. In this regard, it is shown in FIG. 6 that the electrode voltage line HL is connected to the driving voltage line PL arranged on the electrode voltage line HL through a contact hole 1158. The electrode voltage line HL may have the same voltage level (a constant voltage, e.g. +5V) as that of the driving voltage line PL. It may be understood that the electrode voltage line HL is a driving voltage line in a transverse direction.

Since the driving voltage line PL extends in a y-direction and the electrode voltage line HL electrically connected to the driving voltage line PL extends in the x-direction intersecting with the y-direction, a plurality of driving voltage lines PL and electrode voltage lines HL may constitute a mesh structure in the display area.

The data line DL, the driving voltage line PL, the initialization connection line 1173, and the node connection line 1174 may be arranged over the second storage capacitor plate Cst2 and the electrode voltage line HL with a third insulating layer 113 (see FIG. 7) including an inorganic material therebetween. The data line DL, the driving voltage line PL, the initialization connection line 1173, and the node connection line 1174 may include a single layer or a multi-layer including Al, Cu, or Ti. In an exemplary embodiment of the inventive concept, the driving voltage line PL and the data line DL may have a multi-layered structure of Ti/Al/Ti.

The data line DL may extend in the y-direction and be connected to the switching source electrode S2 of the switching thin film transistor T2 through a contact hole 1154. A portion of the data line DL may be the switching source electrode S2 (in other words, an electrode layer).

The driving voltage line PL may extend in the y-direction and be connected to the electrode voltage line HL through the contact hole 1158 as described above. In addition, the driving voltage line PL may be connected to the operation control thin film transistor T5 through a contact hole 1155. The driving voltage line PL may be connected to the operation control drain electrode D5 through the contact hole 1155.

One end of the initialization connection line 1173 may be connected to the first and second initialization thin film transistors T4 and T7 through a contact hole 1152, and the other end of the initialization connection line 1173 may be connected to the initialization voltage line VL through a contact hole 1151.

One end of the node connection line 1174 may be connected to the compensation drain electrode D3 through a contact hole 1156, and the other end of the node connection line 1174 may be connected to the driving gate electrode G1 through a contact hole 1157.

A fourth insulating layer 114 and a fifth insulating layer 115 each including an organic material may be located on the data line DL, the driving voltage line PL, the initialization connection line 1173, the node connection line 1174, and a connection metal 1175. In this case, the contact metal 1176 is located on the fourth insulating layer 114, and the pixel electrode 210 is arranged on the fifth insulating layer 115. In this case, the initialization voltage line VL may be arranged on the same layer on which the contact metal 1176 is arranged and may include the same material as that of the contact metal 1176.

The pixel electrode 210 may be connected to the emission control thin film transistor T6. The pixel electrode 210 may be connected to the contact metal 1176 through a contact hole CH, the contact metal 1176 may be connected to the connection metal 1175 through a contact hole 1163, and the connection metal 1175 may be connected to the emission control drain electrode D6 through a contact hole 1153. In other words, the pixel electrode 210 may directly contact the contact metal 1176, the contact metal 1176 may directly contact the connection metal 1175 and the connection metal 1175 may directly contact the emission control drain electrode D6.

Referring to FIG. 7, edges of the pixel electrode 210 may be covered by a sixth insulating layer 116 on the fifth insulating layer 115, and a central area of the pixel electrode 210 may be exposed through an opening of the sixth insulating layer 116. The sixth insulating layer 116 may include an organic material such as acryl, benzocyclobutene (BCB), polyimide, or hexamethyldisiloxane (HMDSO). Alternatively, the sixth insulating layer 116 may include an inorganic material.

The pixel electrode 210 may include a reflective layer including silver (Ag), magnesium (Mg), Aluminum (A), platinum (Pt), palladium (Pd), gold (Au), nickel (Ni), neodymium (Nd), iridium (Ir), chromium (Cr), or a compound thereof. In another exemplary embodiment of the inventive concept, the pixel electrode 210 may further include a layer including indium tin oxide (ITO), indium zinc oxide (IZO), zinc oxide (ZnO), or Indium oxide ($In_2O_3$) on/under the reflective layer. An intermediate layer 220 is arranged on a portion of the pixel electrode 210 that is exposed through the opening in the sixth insulating layer 116.

The intermediate layer 220 includes an emission layer EML on the portion of the pixel electrode 210 that is exposed through the opening of the sixth insulating layer 116. The emission layer EML may include a polymer organic material or a low molecular weight organic material emitting light of a predetermined color. For convenience of description, only the emission layer EML of the intermediate layer 220 is shown. In an exemplary embodiment of the inventive concept, the intermediate layer 220 may further include a first functional layer under the emission layer EML and/or a second functional layer on the emission layer EML.

The first functional layer may include a single layer or a multi-layer. For example, in the case where the first functional layer includes a polymer material, the functional layer may be a hole transport layer (HTL), which has a single-layered structure. The functional layer may include poly-(3,4)-ethylene-dihydroxy thiophene (PEDOT) or polyaniline (PANI). In the case where the first functional layer includes a low molecular weight material, the first functional layer may include a hole injection layer (HIL) and an HTL.

The second functional layer may be omitted. For example, in the case where the first functional layer and the emission layer EML include a polymer material, the second functional layer is formed to make a characteristic of the organic light-emitting diode OLED excellent. The second functional layer may include a single layer or a multi-layer. The second functional layer may include an electron transport layer (ETL) and/or an electron injection layer (EIL).

An opposite electrode 230 faces the pixel electrode 210 with the intermediate layer 220 therebetween. The opposite electrode 230 may include a conductive material having a low work function. For example, the opposite electrode 230 may include a (semi) transparent layer including Ag, Mg, Al, Pt, Pd, Au, Ni, Nd, Ir, Cr, Li, Ca, or an alloy thereof. Alternatively, the opposite electrode 230 may further include a layer including ITO, IZO, ZnO, or $In_2O_3$ on/under the (semi) transparent layer including the above material.

Though not shown in FIG. 7, a display element layer 200 arranged over the substrate 100, for example, layers ranging from the buffer layer 111*a* to the opposite electrode 230, may be covered by an encapsulation member, for example, an encapsulation substrate or a thin-film encapsulation layer.

Figure 8:
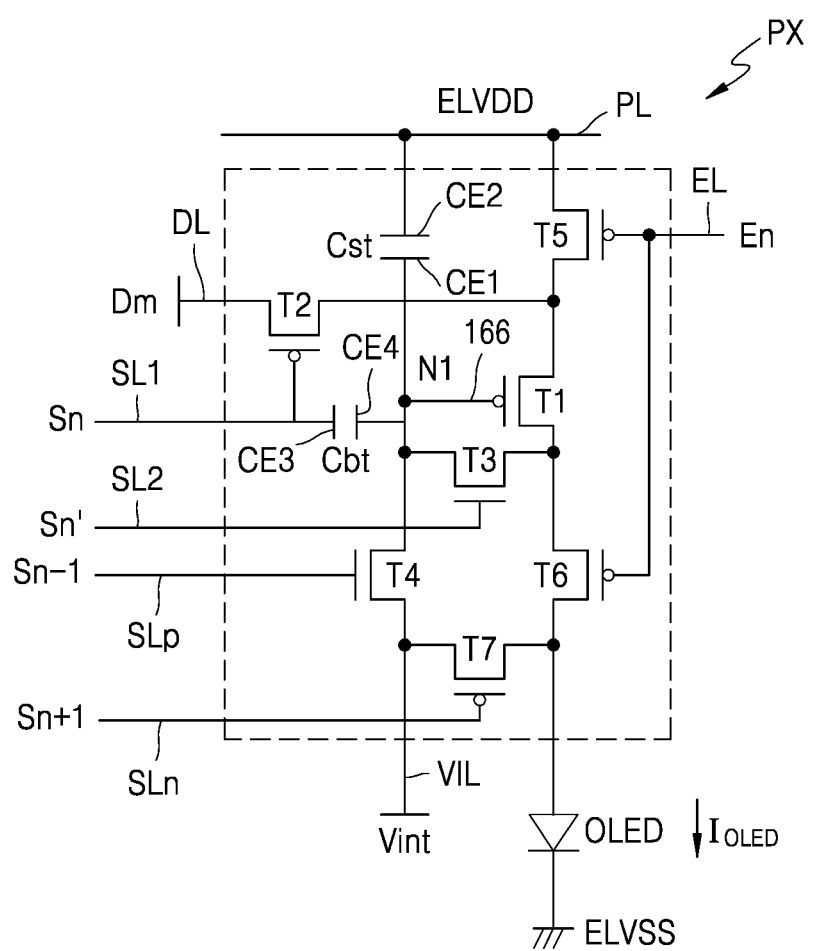
FIG. 8 is an equivalent circuit diagram of a pixel according to an exemplary embodiment of the inventive concept.
Figure 9:
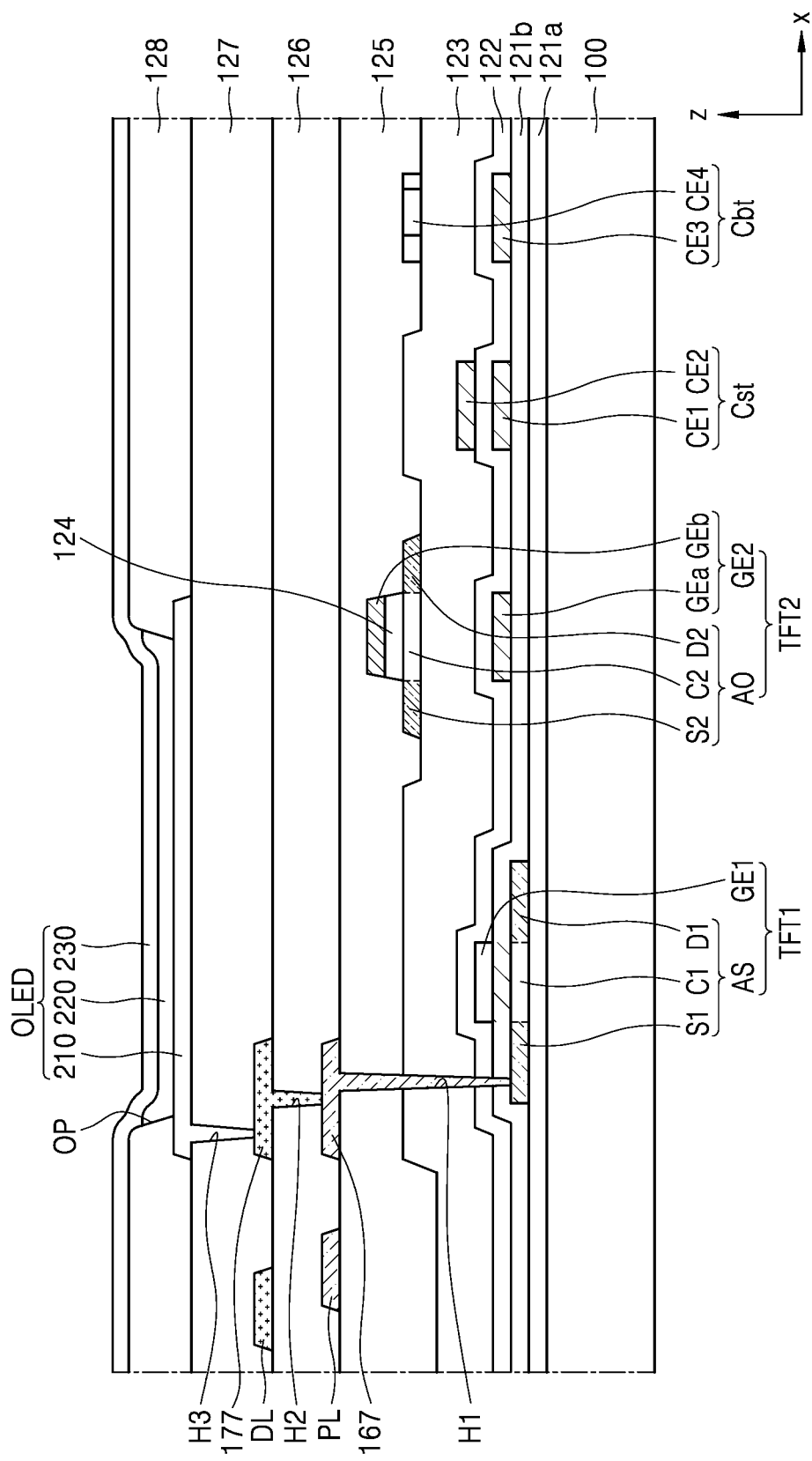
FIG. 9 is a cross-sectional view of a portion of a pixel of FIG. 8.

FIG. 8 is an equivalent circuit diagram of a pixel according to an exemplary embodiment of the inventive concept, and FIG. 9 is a cross-sectional view of a portion of a pixel of FIG. 8.

A pixel PX according to an exemplary embodiment of the inventive concept may have the circuit structure of FIG. 5 or a circuit structure of FIG. 8.

Referring to FIG. 8, the pixel PX includes signal lines SL1, SL2, SLp, SLn, EL, and DL, the plurality of thin film transistors T1, T2, T3, T4, T5, T6, and T7 connected to the signal lines SL1, SL2, SLp, SLn, EL, and DL, the storage capacitor Cst, a boost capacitor Cbt, an initialization voltage line VIL, the driving voltage line PL, and the organic light-emitting diode OLED as a display element. In an exemplary embodiment of the inventive concept, at least one of the signal lines SL1, SL2, SLp, SLn, EL, and DL, for example, the initialization voltage line VIL and/or the driving voltage line PL may be shared by pixels PX that neighbor each other.

The thin film transistors may include the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7.

Some of the plurality of thin film transistors T1, T2, T3, T4, T5, T6, and T7 may be n-channel metal oxide semiconductor (NMOS) field effect transistors, and the rest of the thin film transistors T1, T2, T3, T4, T5, T6, and T7 may be p-channel metal oxide semiconductor (PMOS) field effect transistors.

For example, as shown in FIG. 8, the compensation thin film transistor T3 and the first initialization thin film transistor T4 among the plurality of thin film transistors T1, T2, T3, T4, T5, T6, and T7 may be NMOS field effect transistors, and the rest of the thin film transistors may be PMOS field effect transistors.

In another exemplary embodiment of the inventive concept, the compensation thin film transistor T3, the first initialization thin film transistor T4, and the second initialization thin film transistor T7 among the plurality of thin film transistors T1, T2, T3, T4, T5, T6, and T7 may be NMOS field effect transistors, and the rest of the thin film transistors T1, T2, T3, T4, T5, T6, and T7 may be PMOS field effect transistors. Alternatively, only one of the plurality of thin film transistors T1, T2, T3, T4, T5, T6, and T7 may be an NMOS field effect transistor, and the rest of the thin film transistors T1, T2, T3, T4, T5, T6, and T7 may be PMOS field effect transistors. Alternatively, all of the plurality of thin film transistors T1, T2, T3, T4, T5, T6, and T7 may be NMOS field effect transistors.

The signal lines include a first scan line SL1, a second scan line SL2, a previous scan line SLp, an emission control line EL, a next scan line SLn, and a data line DL.

The first scan line SL1 transfers a first scan signal Sn, the second scan line SL2 transfers a second scan signal Sn', the previous scan line SLp transfers a previous scan signal Sn−1, the emission control line EL transfers an emission control signal En to the operation control thin film transistor T5 and the emission control thin film transistor T6, the next scan line SLn transfers a next scan signal Sn+1 to the second initialization thin film transistor T7. The signal lines further include the data line DL intersecting with the first scan line SL1 and for transferring a data signal Dm.

The driving voltage line PL transfers a driving voltage ELVDD to the driving thin film transistor T1, and the initialization voltage line VIL transfers an initialization voltage Vint initializing the driving thin film transistor T1 and the pixel electrode the organic light-emitting diode OLED.

A driving gate electrode of the driving thin film transistor T1 is connected to the storage capacitor Cst, a driving source electrode of the driving thin film transistor T1 is connected to the driving voltage line PL through the operation control thin film transistor T5, and a driving drain electrode of the driving thin film transistor T1 is electrically connected to a pixel electrode of the organic light-emitting diode OLED through the emission control thin film transistor T6. The driving thin film transistor T1 receives a data signal Dm according to a switching operation of the switching thin film transistor T2 and supplies a driving current $I_{OLED}$ to the organic light-emitting diode OLED. For example, when the driving thin film transistor T1 is turned on, the driving current $I_{OLED}$ corresponding to the data signal Dm may be supplied to the organic light-emitting diode OLED.

A switching gate electrode of the switching thin film transistor T2 is connected to the first scan line SL, a switching source electrode of the switching thin film transistor T2 is connected to the data line DL, and a switching drain electrode of the switching thin film transistor T2 is connected to the driving source electrode of the driving thin film transistor T1 and also connected to the driving voltage line PL through the operation control thin film transistor T5. The switching thin film transistor T2 is turned on in response to a first scan signal Sn transferred through the first scan line SL and performs a switching operation of transferring a data signal Dm transferred through the data line DL to the driving source electrode of the driving thin film transistor T1.

A compensation gate electrode of the compensation thin film transistor T3 is connected to the second scan line SL2. A compensation drain electrode of the compensation thin film transistor T3 is connected to the driving drain electrode of the driving thin film transistor T1 and also connected to the pixel electrode of the organic light-emitting diode OLED through the emission control thin film transistor T6. A compensation source electrode of the compensation thin film transistor T3 is connected to a first electrode CE1 of the storage capacitor Cst and the driving gate electrode of the driving thin film transistor T1 through the node connection line 166. For example, the compensation thin film transistor T3 and the driving gate electrode of the driving thin film transistor T1 connect at first node N1. In addition, the compensation source electrode of the compensation thin film transistor T3 is connected to a first initialization drain electrode of the first initialization thin film transistor T4.

The compensation thin film transistor T3 is turned on in response to a second scan signal Sn' transferred through the second scan line SL2 and diode-connects the driving thin film transistor T1 by electrically connecting the driving gate electrode of the driving thin film transistor T1 to the driving drain electrode of the driving thin film transistor T1.

A first initialization gate electrode of the first initialization thin film transistor T4 is connected to the previous scan line SLp. A first initialization source electrode of the first initialization thin film transistor T4 is connected to a second initialization source electrode of the second initialization thin film transistor T7 and the initialization voltage line VIL. The first initialization drain electrode of the first initialization thin film transistor T4 is connected to the first electrode CE1 of the storage capacitor Cst, the compensation source electrode of the compensation thin film transistor T3, and the driving gate electrode of the driving thin film transistor T1. The first initialization thin film transistor T4 is turned on in response to a previous scan signal Sn−1 transferred through the previous scan line SLp and performs an initialization operation of transferring an initialization voltage Vint to the driving gate electrode of the driving thin film transistor T1, thereby initializing a voltage of the driving gate electrode of the driving thin film transistor T1.

An operation control gate electrode of the operation control thin film transistor T5 is connected to the emission control line EL, an operation control source electrode of the operation control thin film transistor T5 is connected to the driving voltage line PL, and an operation control drain electrode of the operation control thin film transistor T5 is connected to the driving source electrode of the driving thin film transistor T1 and the switching drain electrode of the switching thin film transistor T2.

An emission control gate electrode of the emission control thin film transistor T6 is connected to the emission control line EL, an emission control source electrode of the emission control thin film transistor T6 is connected to the driving drain electrode of the driving thin film transistor T1 and the compensation drain electrode of the compensation thin film transistor T3, and an emission control drain electrode of the emission control thin film transistor T6 is connected to a second initialization drain electrode of the second initialization thin film transistor T7 and the pixel electrode of the organic light-emitting diode OLED.

The operation control thin film transistor T5 and the emission control thin film transistor T6 are simultaneously turned on in response to an emission control signal En transferred through the emission control line EL to allow the driving voltage ELVDD to be transferred to the organic light-emitting diode OLED and thus the driving current $I_{OLED}$ to flow through the organic light-emitting diode OLED.

A second initialization gate electrode of the second initialization thin film transistor T7 is connected to the next scan line SLn, a second initialization drain electrode of the second initialization thin film transistor T7 is connected to the emission control drain electrode of the emission control thin film transistor T6 and the pixel electrode of the organic light-emitting diode OLED, and a second initialization source electrode of the second initialization thin film transistor T7 is connected to the first initialization source electrode of the first initialization thin film transistor T4 and the initialization voltage line VIL. The second initialization thin film transistor T7 is turned on in response to a next scan signal Sn+1 transferred through the next scan line SLn and initializes the pixel electrode of the organic light-emitting diode OLED.

The second initialization thin film transistor T7 may be connected to the next scan line SLn as shown in FIG. 8. In another exemplary embodiment of the inventive concept, the second initialization thin film transistor T7 may be connected to the emission control line EL and driven in response to an emission control signal En. Locations of source electrodes and drain electrodes of FIG. 8 may be exchanged depending on a kind (a p-type or an n-type) of a transistor.

The storage capacitor Cst includes the first electrode CE1 and the second electrode CE2. The first electrode CE1 of the storage capacitor Cst serves as a bottom electrode and is connected to the driving gate electrode of the driving thin film transistor T1, and the second electrode CE2 of the storage capacitor Cst serves as a top electrode and is connected to the driving voltage line PL. The storage capacitor Cst may store an amount of charge corresponding to a difference between a voltage of the driving gate electrode of the driving thin film transistor T1 and the driving voltage ELVDD.

The boost capacitor Cbt includes a third electrode CE3 and a fourth electrode CE4. As shown in the equivalent circuit diagram of FIG. 8, the third electrode CE3 may be connected to the switching gate electrode of the switching thin film transistor T2 and the first scan line SL1, and the fourth electrode CE4 may be connected to the compensation source electrode of the compensation thin film transistor T3 and the node connection line 166. For example, the fourth electrode CE4 may be connected to the first node N1. The boost capacitor Cbt may raise a voltage of the first node N1 when a first scan signal Sn supplied to the first scan line S1 is turned off. When the voltage of the first node N1 is raised, a black gradation may be clearly expressed.

The first node N1 may be an area in which the driving gate electrode of the driving thin film transistor T1, the compensation source electrode of the compensation thin film transistor T3, the first initialization drain electrode of the first initialization thin film transistor T4, and the fourth electrode CE4 of the boost capacitor Cbt are connected.

A specific operation of each pixel PX according to an exemplary embodiment of the inventive concept is described below.

During an initialization period, when a previous scan signal Sn−1 is supplied through the previous scan line SLp, the first initialization thin film transistor T4 is turned on in response to the previous scan signal Sn−1, and the driving thin film transistor T1 is initialized by the initialization voltage Vint supplied from the initialization voltage line VIL.

During a data programming period, when a first scan signal Sn and a second scan signal Sn' are supplied through the first scan line SL and the second scan line SL2, the switching thin film transistor T2 and the compensation thin film transistor T3 are turned on in response to the first scan signal Sn and the second scan signal Sn'. In this case, the driving thin film transistor T1 is diode-connected and is forward-biased by the compensation thin film transistor T3 that is turned on.

Then, a compensation voltage Dm+Vth (Vth has a (−) value) is applied to the driving gate electrode of the driving thin film transistor T1. Here, the compensation voltage Dm+Vth is reduced by a threshold voltage Vth of the driving thin film transistor T1 from a data signal Dm supplied from the data line DL.

The driving voltage ELVDD and the compensation voltage Dm+Vth are applied to two opposite end portions (e.g., CE1 and CE2) of the storage capacitor Cst, and an amount of charge that corresponds to a voltage difference between the two opposite end portions is stored in the storage capacitor Cst.

During an emission period, the operation control thin film transistor T5 and the emission control thin film transistor T6 are turned on in response to an emission control signal En supplied from the emission control line EL. A driving current $I_{OLED}$ occurs and is supplied to the organic light-emitting diode OLED through the emission control thin film transistor T6. Here, the driving current $I_{OLED}$ corresponds to a voltage difference between a voltage of the driving gate electrode of the driving thin film transistor T1 and the driving voltage ELVDD.

In the present embodiment, at least one of the plurality of thin film transistors T1, T2, T3, T4, T5, T6, and T7 includes a semiconductor layer including an oxide, and the rest of the thin film transistors include T1, T2, T3, T4, T5, T6, and T7 a semiconductor layer including silicon.

For example, the driving thin film transistor T1 directly influencing the brightness of the display device may include a semiconductor layer including polycrystalline silicon having high reliability. Accordingly, the display device of a high resolution may be implemented through this configuration.

Since an oxide semiconductor has a high carrier mobility and a low leakage current, a voltage drop is not large even when a driving time is long. In other words, since a color change of an image corresponding to a voltage drop is not large even during a low frequency driving, the display device may be driven at a low frequency.

Since an oxide semiconductor has a low leakage current, at least one of the compensation thin film transistor T3, the first initialization thin film transistor T4, and the second initialization thin film transistor T7 that are connected to the driving gate electrode of the driving thin film transistor T1 may include an oxide semiconductor. Therefore, a leakage current that may flow to the driving gate electrode of the driving thin film transistor T1 may be prevented, and simultaneously, power consumption may be reduced.

Referring to FIG. 9, a cross section of the pixel structure of FIG. 8 is described.

Referring to FIG. 9, the display device 10 according to an exemplary embodiment of the inventive concept may include the substrate 100, a first thin film transistor TFT1 including a silicon semiconductor, a second thin film transistor TFT2 including an oxide semiconductor, a storage capacitor Cst, and a boost capacitor Cbt. The first thin film transistor TFT1 may be the driving thin film transistor T1, the switching thin film transistor T2, the operation control thin film transistor T5, the emission control thin film transistor T6, or the second initialization thin film transistor T7 of FIG. 2. The second thin film transistor TFT2 may be the compensation thin film transistor T3 or the first initialization thin film transistor T4 of FIG. 2.

A buffer layer 121a may increase the flatness of a top surface of the substrate 100 and include an oxide layer including $SiO_x$ and/or a nitride layer including $SiN_x$, or SiON.

A barrier layer may be further arranged between the substrate 100 and the buffer layer 121a. The barrier layer may prevent or minimize the penetration of impurities from the substrate 100, etc. into a silicon semiconductor layer. The barrier layer may include an inorganic material and/or an organic material, the inorganic material including an oxide and a nitride. The barrier layer may have a single layered structure or a multi-layered structure of an inorganic material and an organic material.

A first semiconductor layer AS of the first thin film transistor TFT1 including the silicon semiconductor may be arranged on the buffer layer 121a. The first semiconductor layer AS may include a source region S, a drain region D1, and a channel region C1, the source region S1 and the drain region D1 being doped with impurities and having conductivity, and the channel region C1 being between the source region S1 and the drain region D1. The source region S1 and the drain region D1 may respectively correspond to a source electrode and a drain electrode of the first thin film transistor TFT1. The locations of the source region S1 and the drain region D1 may be exchanged with each other depending on a type of transistor, for example.

A gate electrode GE1 of the first thin film transistor TFT1 is arranged over the first semiconductor layer AS. A first insulating layer 121b may be arranged between the first semiconductor layer AS and the gate electrode GE1.

The first insulating layer 121b may include an inorganic material including an oxide and a nitride. For example, the first insulating layer 121b may include silicon oxide ($SiO_2$), silicon nitride ($SiN_x$), silicon oxynitride (SiON), aluminum oxide ($A_2O_3$), titanium oxide ($TiO_2$), tantalum oxide ($Ta_2O_5$), hafnium oxide ($HfO_2$), or zinc oxide ($ZnO_2$).

The gate electrode GE1 of the first thin film transistor TFT1 may overlap the channel region C1 of the first semiconductor layer AS and include a single layer or a multi-layer including Mo, Cu, or Ti.

The first electrode CE1 of the storage capacitor Cst and the third electrode CE3 of the boost capacitor Cbt may be arranged on the same layer on which the gate electrode GE1 of the first thin film transistor TFT1 is arranged. For example, the first electrode CE1 of the storage capacitor Cst and the third electrode CE3 of the boost capacitor Cbt may be arranged on the first insulating layer 121b. The first electrode CE1 of the storage capacitor Cst and the third electrode CE3 of the boost capacitor Cbt may include the same material as that of the gate electrode GE1 of the first thin film transistor TFT1. For example, the first electrode CE1 of the storage capacitor Cst and the third electrode CE3 of the boost capacitor Cbt may include a single layer or a multi-layer including Mo, Cu, or Ti.

A second insulating layer 122 may be arranged on the gate electrode GE1 of the first thin film transistor TFT1, the first electrode CE1 of the storage capacitor Cst, and the third electrode CE3 of the boost capacitor Cbt.

The second insulating layer 122 may include an inorganic material including an oxide and a nitride. For example, the second insulating layer 122 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The second electrode CE2 of the storage capacitor Cst may be arranged on the second insulating layer 122 to overlap the first electrode CE1 of the storage capacitor Cst. The second electrode CE2 may include a single layer or a multi-layer including Mo, Cu, or Ti.

A third insulating layer 123 may be arranged on the second electrode CE2 of the storage capacitor Cst. The third insulating layer 123 may include an inorganic material including an oxide and a nitride. For example, the third insulating layer 123 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

Though it is shown in FIG. 9 that the storage capacitor Cst is apart from the first thin film transistor TFT1, the storage capacitor Cst may overlap the first thin film transistor TFT1. For example, the second electrode CE2 may be arranged over the gate electrode GE1 of the first thin film transistor TFT1 to overlap the gate electrode GE1. In this case, the gate electrode GE1 of the first thin film transistor TFT1 may function as gate electrode but also as the first electrode CE1 of the storage capacitor Cst.

A second semiconductor layer AO of the second thin film transistor TFT2 may be arranged on the third insulating layer 123, and include an oxide semiconductor. The second semiconductor layer AO may include a source region S2, a drain region D2, and a channel region C2, the source region S2 and the drain region D2 having conductivity and being apart from each other, and the channel region C1 being between the source region S1 and the drain region D1. The oxide semiconductor may include Zn oxide, In—Zn oxide, and Ga—In—Zn oxide as a Zn oxide-based material. For example, the second semiconductor layer AO may include an IGZO (In—Ga—Zn—O) semiconductor, an ITZO (In—Sn—Zn—O) semiconductor, or an IGTZO (In—Ga—Sn—Zn—O) semiconductor including ZnO containing a metal such as In, Ga, and Sn. The source region S2 and the drain region D2 of the second semiconductor layer AO may be formed by adjusting a carrier concentration of an oxide semiconductor and making the oxide semiconductor conductive. For example, the source region S2 and the drain region D2 may be formed by performing a plasma process that uses a hydrogen (H)-based gas, a fluorine (F)-based gas, or a combination thereof on the oxide semiconductor and increasing the carrier concentration.

A first gate electrode GEa may be arranged below the second semiconductor layer AO of the second thin film transistor TFT2, and a second gate electrode GEb may be arranged over the second semiconductor layer AO of the second thin film transistor TFT2. In other words, a gate electrode GE2 of the second thin film transistor TFT2 may have a dual gate electrode structure. The gate electrodes GE2 of the second thin film transistor TFT2 may be connected to each other outside the display area DA. The gate electrode GE2 of the second thin film transistor TFT2 may shield light.

A third insulating layer 123 may be arranged between the first gate electrode GEa of the second thin film transistor TFT2 and the second semiconductor layer AO. The first gate electrode GEa of the second thin film transistor TFT2 may be arranged on the same layer as the first electrode CE1 of the storage capacitor Cst is arranged and may include the same material as that of the first electrode CE1. The channel region C2 of the second semiconductor layer AO may overlap the first gate electrode GEa of the second thin film transistor TFT2.

A fourth insulating layer 124 may be arranged between the second semiconductor layer AO of the second thin film transistor TFT2 and the second gate electrode GEb. The second gate electrode GEb may overlap the channel region C2 of the second semiconductor layer AO. The fourth insulating layer 124 may be formed during the same mask process as a mask process of the second gate electrode GEb. In this case, the fourth insulating layer 124 may be formed in the same shape as that of the second gate electrode GEb.

The fourth insulating layer 124 may include an inorganic material including an oxide and a nitride. For example, the fourth insulating layer 124 may include silicon oxide ($SiO_2$), silicon nitride ($SiN\%$), silicon oxynitride (SiON), aluminum oxide ($A_2O_3$), titanium oxide ($TiO_2$), tantalum oxide ($Ta_2O_5$), hafnium oxide ($HfO_2$), or zinc oxide ($ZnO_2$). The second gate electrode GEb may include a single layer or a multi-layer including Mo, Cu, or Ti.

The fourth electrode CE4 of the boost capacitor Cbt may be arranged on the third insulating layer 123 to overlap the third electrode CE3. The fourth electrode CE4 of the boost capacitor Cbt may include an oxide semiconductor. In an exemplary embodiment of the inventive concept, the fourth electrode CE4 of the boost capacitor Cbt may be a portion that extends from the second semiconductor layer AO of the second thin film transistor TFT2 and overlaps the third electrode CE3. The second insulating layer 122 and the third insulating layer 123 may be arranged between the third electrode CE3 and the fourth electrode CE4.

A fifth insulating layer 125 may cover the second thin film transistor TFT2. The fifth insulating layer 125 may be arranged on the second gate electrode GEb. A power voltage line PL and a first connection electrode 167 may be arranged on the fifth insulating layer 125.

The fifth insulating layer 125 may include an inorganic material including an oxide and a nitride. For example, the fifth insulating layer 125 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The power voltage line PL and the first connection electrode 167 may include a material having a high conductivity such as metal and a conductive oxide. For example, the power voltage line PL and the first connection electrode 167 may include a single layer or a multi-layer including Al, Cu, or Ti. In an exemplary embodiment of the inventive concept, the power voltage line PL and the first connection electrode 167 may include a triple layer of Ti/Al/Ti in which titanium, aluminum, and titanium are sequentially arranged.

The first connection electrode 167 may be connected to the first semiconductor layer AS through a contact hole H1. The contact hole H1 may pass through the first insulating layer 121b, the second insulating layer 122, the third insulating layer 123, and the fifth insulating layer 125 and expose a portion of the first semiconductor layer AS. A portion of the first connection electrode 167 may be inserted into the contact hole H1 and electrically connected to the first semiconductor layer AS.

A sixth insulating layer 126 which is a planarization layer, may be arranged on the power voltage line PL and the first connection electrode 167. The sixth insulating layer 126 may include an organic material such as an acrylic, benzocyclobutene (BCB), polyimide, or hexamethyldisiloxane (HMDSO). Alternatively, the sixth insulating layer 126 may include an inorganic material. The sixth insulating layer 126 serves as a protective layer covering the first thin film transistor TFT1 and the second thin film transistor TFT2, and a top surface of the sixth insulating layer 126 may be flat. The sixth insulating layer 126 may include a single layer or a multi-layer.

A data line DL and a second connection line 177 may be arranged on the sixth insulating layer 126. The data line DL may partially overlap the power voltage line PL. The second connection electrode 177 may be connected to the first connection electrode 167 through a contact hole H2 in the sixth insulating layer 126. The data line DL and the second connection electrode 177 may include a conductive material such as metal and a conductive oxide. For example, the data line DL and the second connection electrode 177 may include a single layer or a multi-layer including Al, Cu, or Ti. A seventh insulating layer 127 may be arranged on the data line DL and the second connection electrode 177.

An organic light-emitting diode OLED may be arranged on the seventh insulating layer 127. The organic light-emitting diode OLED may include the pixel electrode 210, the opposite electrode 230, and the intermediate layer 220, the intermediate layer 220 being arranged between the pixel electrode 210 and the opposite electrode 230 and including an emission layer. The pixel electrode 210 may be connected to the second connection electrode 177 through a contact hole H3 in the seventh insulating layer 127. An eighth insulating layer 128 may define an emission area by including an opening OP exposing a central portion of the pixel electrode 210. Since the organic light-emitting diode OLED has the same structure as that described with reference to FIG. 7, description thereof is omitted.

Figure 10:
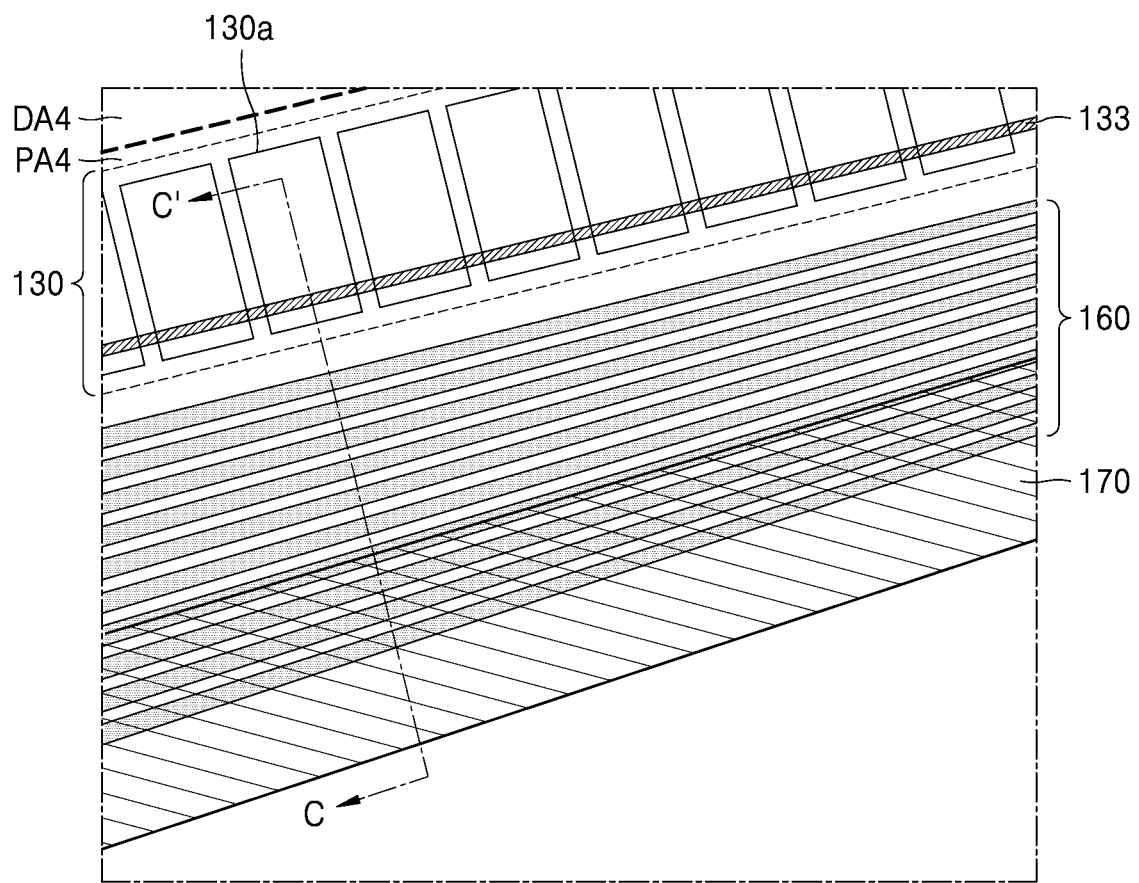
FIG. 10 is a plan view of a portion of a display device according to an exemplary embodiment of the inventive concept.
Figure 11:
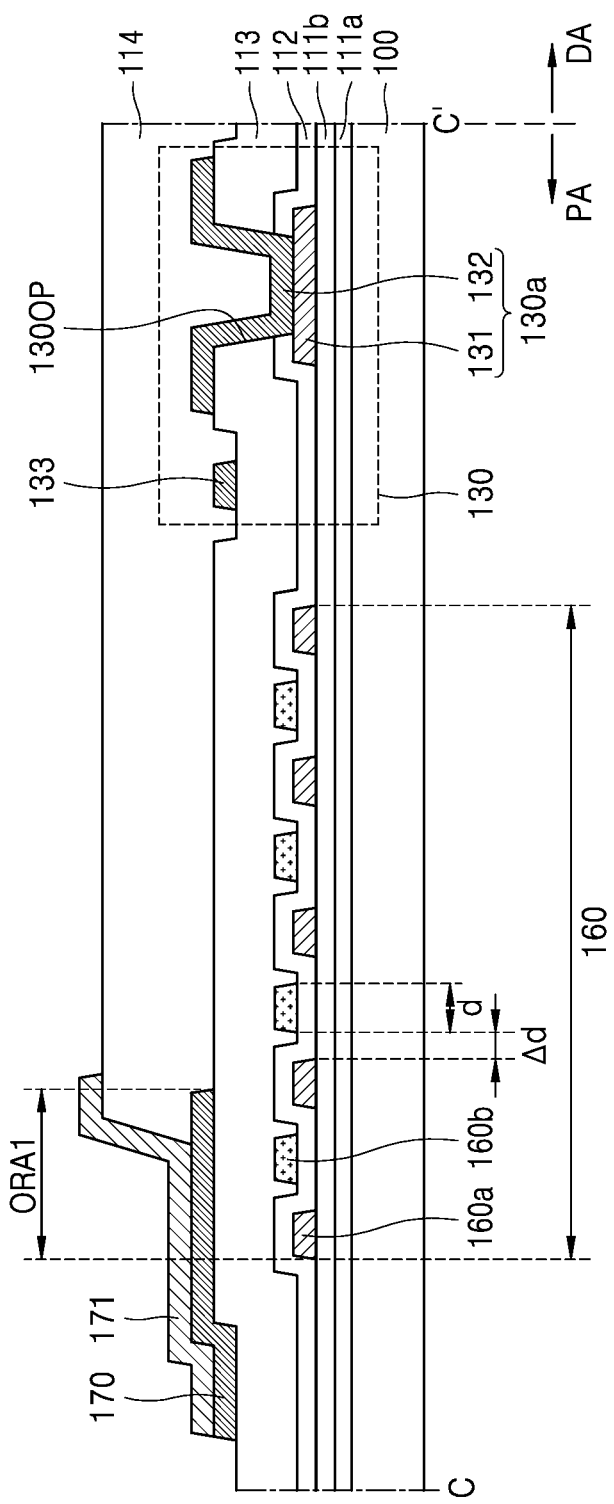
FIG. 11 is a cross-sectional view of a display device taken along line C-C' of FIG. 10.

FIG. 10 is a plan view of a portion of the display device 10 according to an exemplary embodiment of the inventive concept, and FIG. 11 is a cross-sectional view of the display device 10 taken along line C-C' of FIG. 10. FIG. 10 corresponds to a region A of FIG. 4.

Referring to FIG. 10, the second scan driving circuit 130, the fan-out unit 160, and the common power supply line 170 may be sequentially arranged in the fourth peripheral area PA4 outside the fourth display area DA4. For reference, though FIG. 10 shows the fourth display area DA4 and the fourth peripheral area PA4, the third display area DA3 and the third peripheral area PA3 have a configuration similar thereto.

In an exemplary embodiment of the inventive concept, the fan-out unit 160 may overlap the common power supply line 170 in at least a partial region. That the fan-out unit 160 overlaps the common power supply line 170 may mean that the fan-out unit 160 and the common power supply line 170 are arranged on different layers and partial regions thereof overlap each other in a plan view.

Hereinafter, respective insulating layers shown in FIG. 11 are described based on the stacked structure of FIG. 7. Therefore, materials of the respective insulating layers shown in FIG. 11 are the same as those described with reference to FIG. 7.

The respective insulating layers shown in FIG. 11 may correspond to the stacked structure of FIG. 9.

As shown in FIG. 11, the buffer layer 111a and the first insulating layer 111b are arranged on the substrate 100.

The second scan driving circuit 130 may be arranged on the first insulating layer 111b. The second scan driving circuit 130 may include a plurality of circuit units 130a. Each of the plurality of circuit units 130a may be a shift register including a stage. Though FIGS. 10 and 11 show the second scan driving circuit 130, the first scan driving circuit 120 and the emission control circuit 140 may also have a configuration similar thereto.

Each circuit unit 130a may include a first conductive layer 131 on the first insulating layer 111b, and a second conductive layer 132 on the first conductive layer 131. The second insulating layer 112 and the third insulating layer 113 may be arranged between the first conductive layer 131 and the second conductive layer 132. The first conductive layer 131 may be connected to the second conductive layer 132 through an opening 1300P in the second insulating layer 112 and the third insulating layer 113.

Each circuit unit 130a may be connected to a signal line 133 (in other words, a second signal line) arranged in the peripheral area PA and may transfer a scan signal transferred to each circuit unit 130a to the plurality of pixels PX. For convenience of description, though FIG. 10 shows only one signal line, a separate signal line may be connected to each circuit unit 130a. In addition, the signal line 133 connected to each circuit unit 130a may include a plurality of voltage lines and a plurality of clock lines.

Referring to FIGS. 7 and 11, the first conductive layer 131 constituting each circuit unit 130a may include the same material as that of the driving gate electrode G1 of the driving thin film transistor T1, and the second conductive layer 132 may include the same material as that of the data line DL. In addition, a plurality of scan signal lines SL may include the same material as that of the data line DL. The plurality of scan signal lines SL may be arranged on a layer different from a layer on which wirings 160a and 160b of the fan-out unit 160 described below are arranged.

The fan-out unit 160 may be located outside the second scan driving circuit 130. As shown in FIG. 11, the fan-out unit 160 may include the plurality of wirings 160a and 160b. Each of the wirings 160a and 160b may be connected to one data line DL or a plurality of data lines DL.

The fan-out unit 160 may include the plurality of first wirings 160a and the plurality of second wirings 160b. The plurality of first wirings 160a may be arranged on the first insulating layer 111b, and the plurality of second wirings 160b may be arranged on the second insulating layer 112. In this case, the plurality of first wirings 160a do not overlap the plurality of second wirings 160b. In other words, the plurality of second wirings 160b may be alternately arranged with the plurality of first wirings 160a with the second insulating layer 112 therebetween.

Referring to FIGS. 7 and 11, the plurality of first wirings 160a may include the same material as that of the driving gate electrode G1 of the driving thin film transistor T1, and the plurality of second wirings 160b may include the same material as that of the second storage capacitor plate Cst2 of the storage capacitor Cst.

In an exemplary embodiment of the inventive concept, an interval $\Delta d$ between the first wiring 160a and the second wiring 160b may be less than a width d of one of the plurality of wirings 160a and 160b. Since the plurality of first wirings 160a and the plurality of second wirings 160b are arranged on different layers as described above, the interval $\Delta d$ between the first wiring 160a and the second wiring 160b may be reduced. Therefore, a signal interference that may occur between the plurality of wirings 160a and 160b may be minimized.

The plurality of wirings 160a and 160b of the fan-out unit 160 may be covered by the third insulating layer 113. The common power supply line 170 may be arranged on the third insulating layer 113. The common power supply line 170 may have a double-layered structure in which a contact electrode 171 is arranged thereon. A resistance of the common power supply line 170 may be reduced through this configuration. The common power supply line 170 may be connected to the opposite electrode 230 (see FIG. 7) and may supply common power to each pixel PX.

In an exemplary embodiment of the inventive concept, the common power supply line 170 may at least partially overlap the fan-out unit 160. As shown in FIG. 11, the common power supply line 170 may include a first overlapping area ORA1 located over the fan-out unit 160 and overlapping a portion of the plurality of wirings 160a and 160b. As shown in FIG. 4, the fan-out unit 160 may be located in the second peripheral area PA2 and the fourth peripheral area PA4, and the common power supply line 170 may overlap the fan-out unit 160 in a portion of the second peripheral area PA2 and the fourth peripheral area PA4.

As a comparative example, in the case where the common power supply line is arranged outside the fan-out unit such that the common power supply line does not overlap the fan-out unit, since a peripheral area for the common power supply line is needed, there is a limit to how much the peripheral area can be reduced. In contrast, in the display device according to an exemplary embodiment of the inventive concept, since the common power supply line 170 partially overlaps the fan-out unit 160, the peripheral area PA, which is a non-display area, may be minimized.

Figure 12:
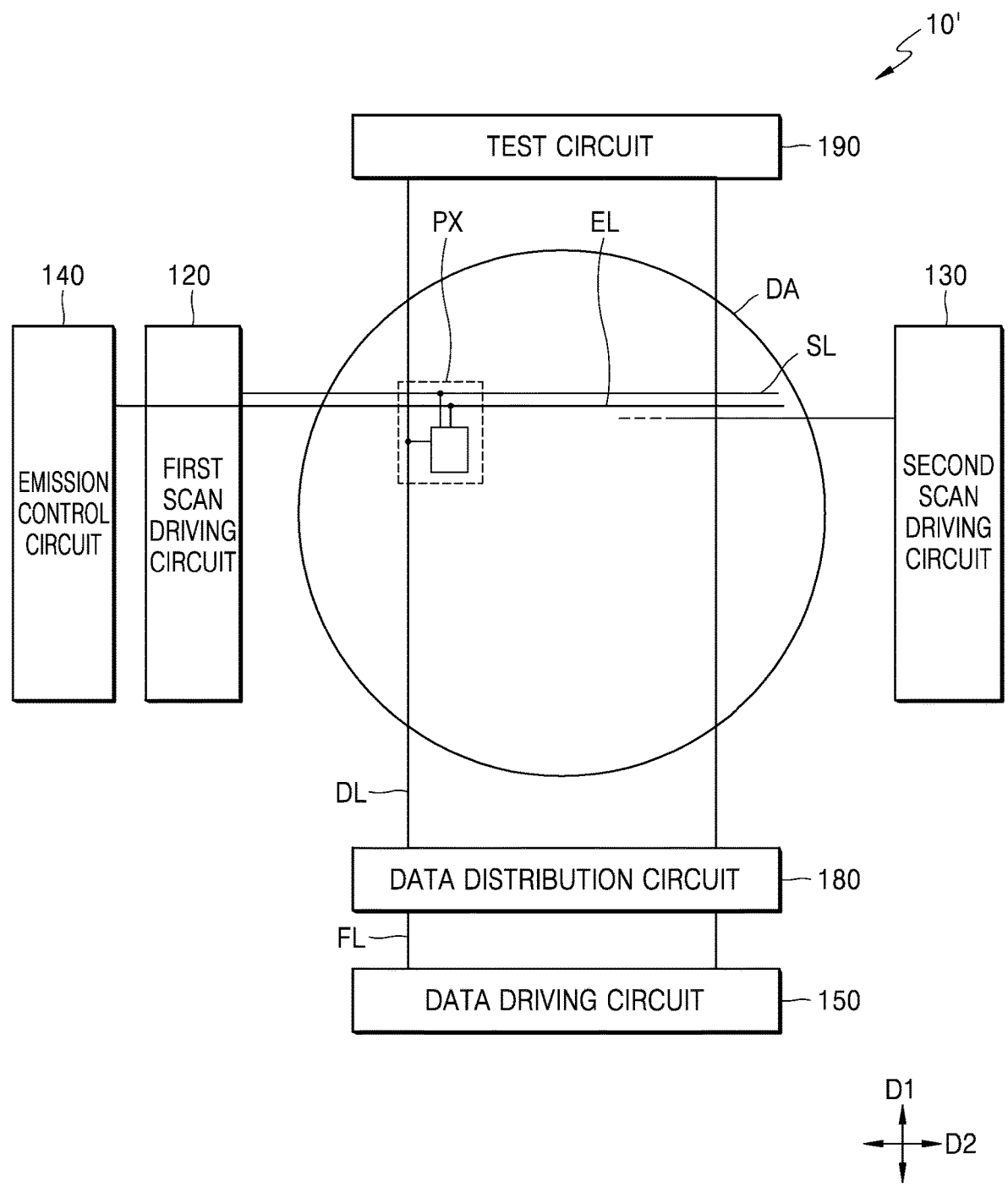
FIG. 12 is a configuration view of a display device according to an exemplary embodiment of the inventive concept.
Figure 14:
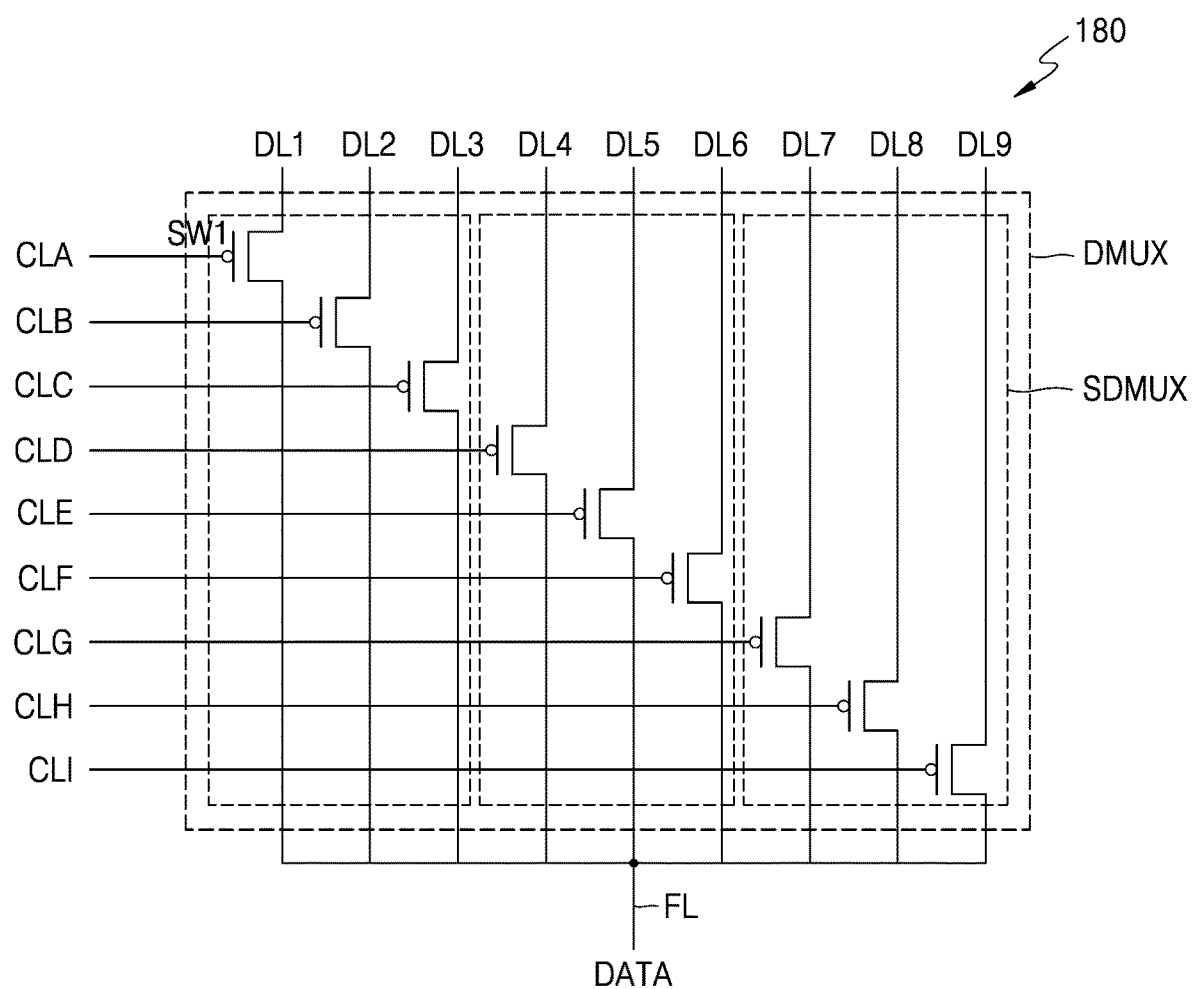
FIG. 14 is a view of a data distribution circuit according to an exemplary embodiment of the inventive concept.
Figure 15:
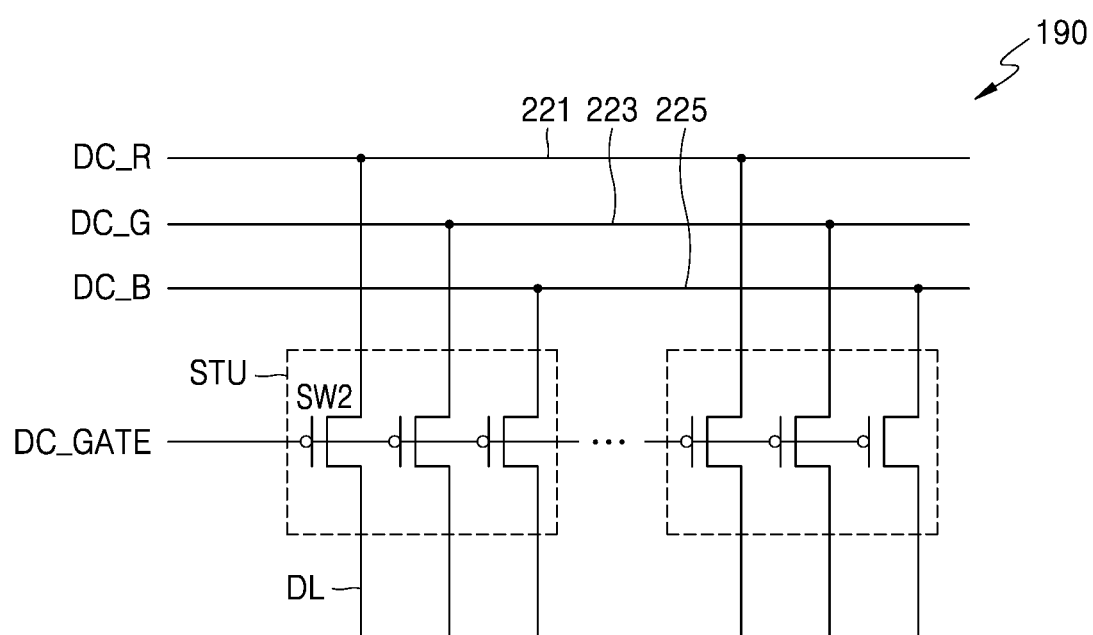
FIG. 15 is a view of a test circuit according to an exemplary embodiment of the inventive concept.

FIG. 12 is a configuration view of a display device 10' according to an exemplary embodiment of the inventive concept, FIG. 13 is a plan view of a display panel 10P' of the display device 10' shown in FIG. 12, FIG. 14 is a view of a data distribution circuit 180 according to an exemplary embodiment of the inventive concept, and FIG. 15 is a view of a test circuit 190 according to an exemplary embodiment of the inventive concept. FIGS. 12 and 13 show the display device 10' in which the display area DA is circular.

Referring to FIGS. 12 and 13, the display device 10' may include the display panel 10P, and the display panel 10P' may include the substrate 100. The substrate 100 may include the display area DA and the peripheral area PA, which is a non-display area, outside the display area DA. The peripheral area PA may surround the display area DA and have a shape corresponding to an edge of the display area DA.

The display device 10' shown in FIG. 12 may further include the data distribution circuit 180 and the test circuit 190 compared to the display device 10 shown in FIG. 3. Hereinafter, the added elements in FIG. 12 are mainly described.

A plurality of circuit units (e.g., stages) of the first scan driving circuit 120 may be distributed in the first peripheral area PA1 and the second peripheral area PA2. A plurality of circuit units (e.g., stages) of the second scan driving circuit 130 may be distributed in the third peripheral area PA3 and the fourth peripheral area PA4. A plurality of circuit units (e.g., stages) of the emission control circuit 140 may be distributed in the first peripheral area PA1 and the second peripheral area PA2.

The data distribution circuit 180 may be arranged between the data driving circuit 150 and the display area DA and connected to the data lines DL to transfer a data signal from the data driving circuit 150 to the data lines DL. The data distribution circuit 180 time-divides a data signal applied through one output line FL of the data driving circuit 150 and may distribute data signals to the plurality of data lines DL.

In an exemplary embodiment of the inventive concept, the data distribution circuit 180 may be arranged in the second peripheral area PA2 and the fourth peripheral area PA4.

As shown in FIG. 14, the data distribution circuit 180 may include a plurality of demultiplexers DMUX. The number of demultiplexers DMUX may be the same as the number of output lines FL. Each demultiplexer DMUX may include a plurality of first switches SW1. The first switch SW1 may be a thin film transistor.

The number of data lines DL connected to the one demultiplexer DMUX may be changed. For example, as shown in FIG. 14, each demultiplexer DMUX may divide a data signal into nine data signals and supply the nine data signals to data lines DL1, DL2, DL3, DL4, DL5, DL6, DL7, DL8, and DL9, the data signal being applied from one output line FL among output lines FL of the data driving circuit 150. Each first switch SW1 may be turned on in response to a corresponding control signal CLA, CLB, CLC, CLD, CLE, CLF, CLG, CLH, or CLI, and may apply a data signal DATA to a corresponding data line DL1, DL2, DL3, DL4, DL5, DL6, DL7, DL8, or DL9. Each demultiplexer DMUX may be divided into a plurality of sub-demultiplexers SDMUX. As shown in FIG. 14, each demultiplexer DMUX may be divided into sub-demultiplexers SDMUX on a three-data line basis. The sub-demultipexers SDMUX of the demultiplexer DMUX may be distributed in the second peripheral area PA2 and the fourth peripheral area PA4.

The test circuit 190 may be connected to the data lines DL and may apply a test signal to the data lines DL. In an exemplary embodiment of the inventive concept, the test circuit 190 may be arranged in the first peripheral area PA1 and the third peripheral area PA3.

As shown in FIG. 15, the test circuit 190 may include a plurality of sub-test circuits STU. Each of the sub-test circuits STU may include second switches SW2 as many as the number of pixels PX constituting a unit pixel UP. FIG. 15 shows an example in which a sub-test circuit STU includes three second switches SW2.

The second switches SW2 may be connected to three data lines DL respectively connected to three pixels PX. The second switch SW2 may be a thin film transistor. Each second switch SW2 may be turned on in response to a control signal DC_GATE and may output a test signal DC_R, DC_G, or DC_B to a corresponding data line DL. For example, the test signal DC_R, DC_G, or DC_B may be applied from a corresponding input line among input lines 221, 223, and 225. The display device 10' may detect whether the pixels PX and the signal lines are defective by using the test circuit 190. The sub-test circuits STU of the test circuit 190 may be distributed in the first peripheral area PA1 and the third peripheral area PA3.

In an exemplary embodiment of the inventive concept, the data distribution circuit 180 may be connected to one end portion of the plurality of data lines DL, and the test circuit 190 may be connected to the other end portion of the plurality of data lines DL.

As shown in FIG. 13, the test circuit 190 may include a plurality of test lines TL (in other words, first signal lines). The plurality of test lines TL may be arranged to circumnavigate an outer side of the display area DA to connect the plurality of sub-test circuits STU to the plurality of data lines DL. The sub-test circuits STU of the test circuit 190 are arranged in only the first peripheral area PA1 and the third peripheral area PA3, but the plurality of test lines TL may also be arranged in the second peripheral area PA2 and the fourth peripheral area PA4.

In an exemplary embodiment of the inventive concept, the plurality of test lines TL may at least partially overlap the fan-out unit 160. As described above, since the fan-out unit 160 is arranged in the second peripheral area PA2 and the fourth peripheral area PA4, the plurality of test lines TL may overlap the fan-out unit 160 in the second peripheral area PA2 and the fourth peripheral area PA4.

Figure 16:
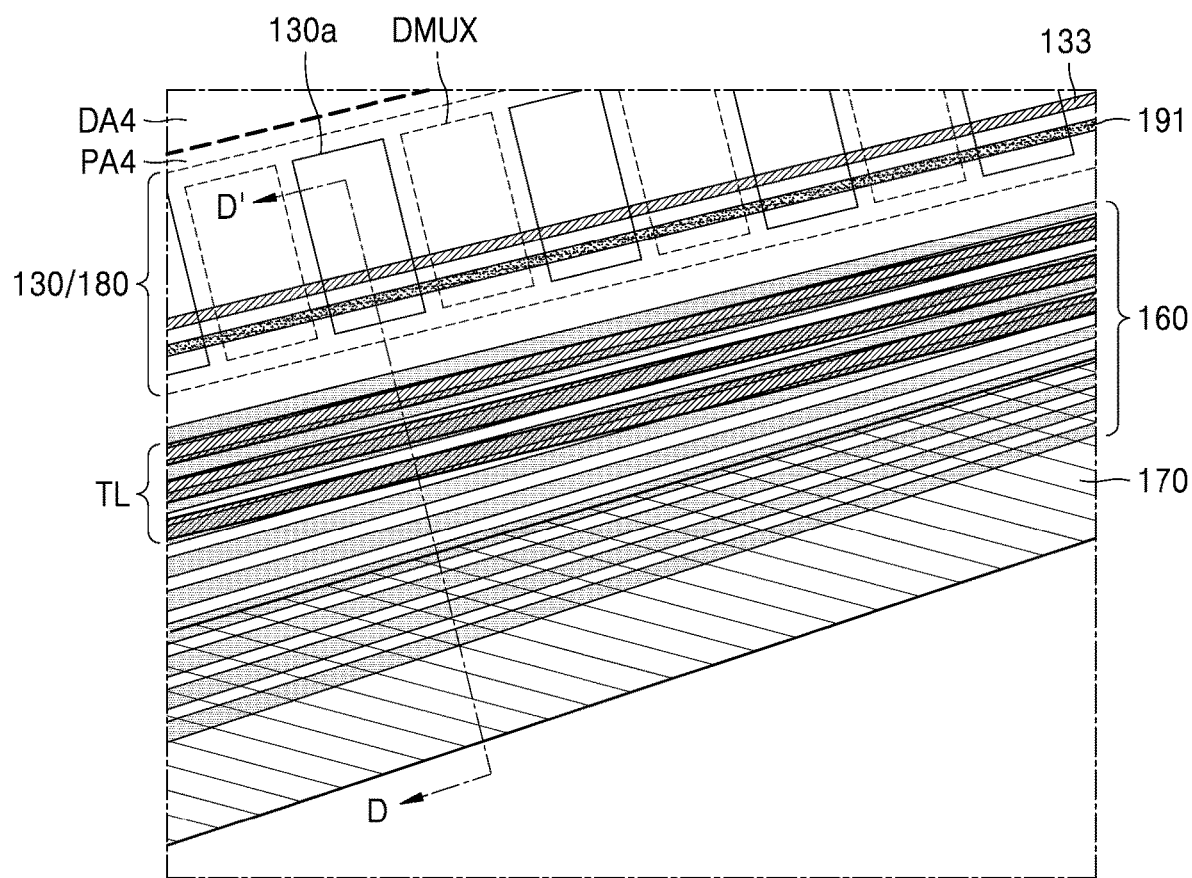
FIG. 16 is a plan view of a portion of a display device according to an exemplary embodiment of the inventive concept.
Figure 17:
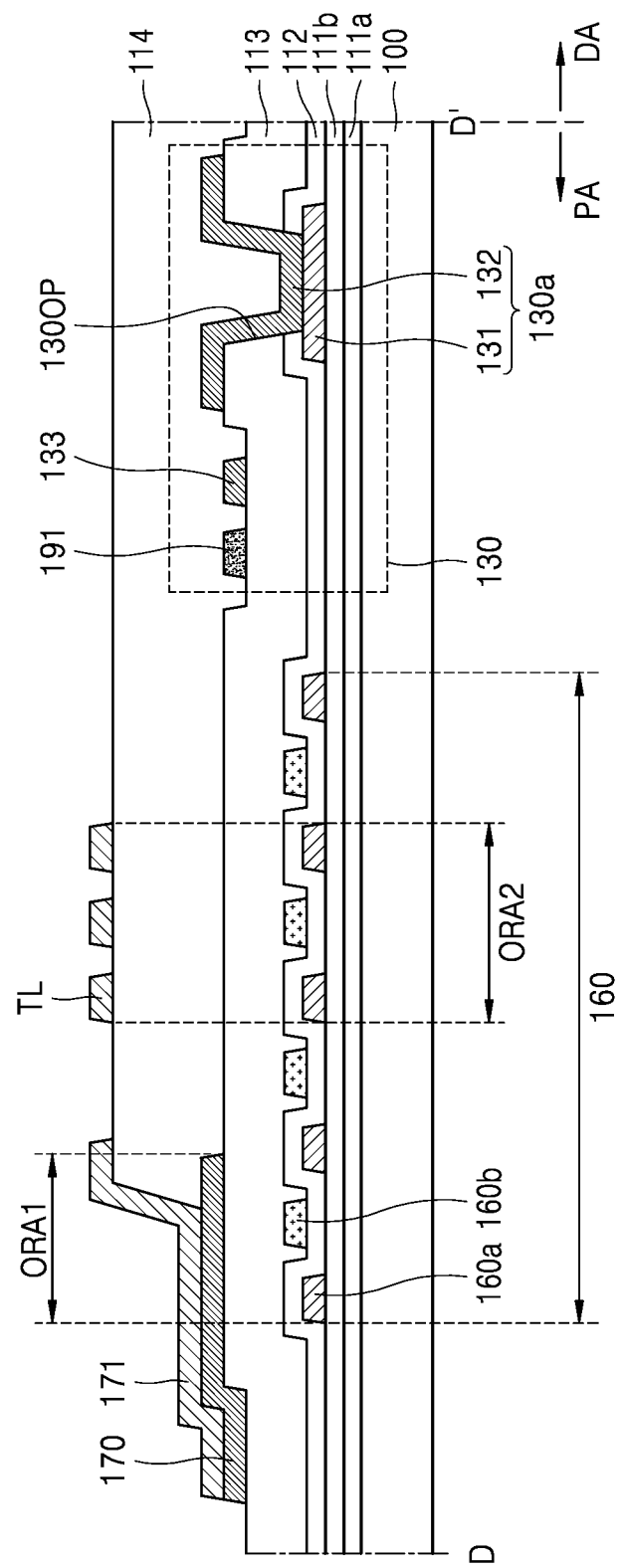
FIG. 17 is a cross-sectional view of a display device taken along line D-D' of FIG. 16.

FIG. 16 is a plan view of a portion of the display device 10' according to an exemplary embodiment of the inventive concept, and FIG. 17 is a cross-sectional view of the display device 10' taken along line D-D' of FIG. 16. FIG. 17 corresponds to a region B of FIG. 13.

Referring to FIG. 16, the second scan driving circuit 130, the data distribution circuit 180, the test line TL, the fan-out unit 160, and the common power supply line 170 may be arranged in the fourth peripheral area PA4 outside the fourth display area DA4. For reference, though FIG. 16 shows fourth display area DA4 and the fourth peripheral area PA4, the third display area DA3 and the third peripheral area PA3 have a configuration similar thereto.

The second scan driving circuit 130 and the data distribution circuit 180 may be arranged in the fourth peripheral area PA4. The second scan driving circuit 130 and the data distribution circuit 180 may respectively include a plurality of circuit units 130*a* and a plurality of demultiplexers DMUX. In an exemplary embodiment of the inventive concept, as shown in FIG. 16, the plurality of circuit units 130*a* and the plurality of demultiplexers DMUX may be alternately arranged. The plurality of circuit units 130*a* and the plurality of demultiplexers DMUX each may be connected to signal lines 133 and 191. Though FIG. 16 shows one signal line 133 and one signal line 191, for convenience of illustration, the signal lines 133 and 191 may be provided as a plurality of signal lines. For example, each signal line 133 may include a plurality of voltage lines and a plurality of dock lines. Each of the plurality of circuit units 130*a* may be connected to the signal line 133, and each of the plurality of demultiplexers DMUX may be connected to the signal line 191.

In an exemplary embodiment of the inventive concept, the fan-out unit 160 may overlap the test line TL. That the fan-out unit 160 may overlap the test line TL may mean that the fan-out unit 160 and the test line TL are arranged on different layers and portions thereof overlap each other in a plan view. In addition, as described with reference to FIG. 10, the fan-out unit 160 may overlap the common power supply line 170. Each test line TL may include a plurality of signal lines for applying a control signal DC_GATE and test signals DC_R, DC_G, and DC_B to a sub-test circuit STU of FIG. 15.

Since the stacked structure of FIG. 17 is the same as that described with reference to FIG. 11, a difference regarding the test line TL is mainly described below.

As shown in FIG. 17, the buffer layer 111*a* and the first insulating layer 111*b* are arranged on the substrate 100. The fan-out unit 160 may be arranged on the first insulating layer 111*b*. The fan-out unit 160 may include the plurality of wirings 160*a* and 160*b*. Each of the wirings 160*a* and 160*b* may be connected to one data line DL or a plurality of data lines DL. In an exemplary embodiment of the inventive concept, each of the plurality of wirings 160a and 160b may be connected to the plurality of data lines DL by the data distribution circuit 180.

The fan-out unit 160 may include the plurality of first wirings 160a and the plurality of second wirings 160b. The plurality of first wirings 160a may be arranged on the first insulating layer 111b, and the plurality of second wirings 160b may be arranged on the second insulating layer 112. In this case, the plurality of first wirings 160a do not overlap the plurality of second wirings 160b. In other words, the plurality of second wirings 160b may be alternately arranged with the plurality of first wirings 160a with the second insulating layer 112 therebetween.

The fan-out unit 160 may be covered by the third insulating layer 113 and the fourth insulating layer 114. The common power supply line 170 may be arranged on the third insulating layer 113, and at least a portion of the common power supply line 170 may overlap the fan-out unit 160 in the first overlapping area ORA1.

The test lines TL may be arranged on the fourth insulating layer 114. The test lines TL may overlap the fan-out unit 160 in a second overlapping area ORA2. Referring to FIGS. 7 and 17, the test lines TL may include the same material as that of the contact metal 1176.

As a comparative example, the test lines may be arranged on the same layer as a layer on which the common power supply line of FIG. 17 is arranged, and may include the same material as that of the common power supply line. However, in this case, since an interval between the test lines and the common power supply line becomes narrow, a signal interference and a parasitic capacitance may occur. In addition, since the test line overlaps the fan-out unit, in the case where the test line is arranged on the third insulating layer, a signal interference and a parasitic capacitance may occur between the test line and the fan-out unit.

Therefore, to prevent signal interference and parasitic capacitance, according to an exemplary embodiment of the inventive concept, the test lines TL may be arranged on the fourth insulating layer 114 with the third insulating layer 113 and the fourth insulating layer 114 therebetween. In an exemplary embodiment of the inventive concept, as shown in FIG. 17, the test lines TL may include the same material as that of the contact electrode 171 arranged on the common power supply line 170. Since the test lines TL are arranged on the fourth insulating layer 114 to prevent the occurrence of the signal interference and the parasitic capacitance between the test lines TL and the fan-out unit 160, the test lines TL may be arranged on the third insulating layer 113 in a region in which the test lines TL do not overlap the fan-out unit 160. The above structure is described with reference to FIGS. 18 and 19.

Figure 18:
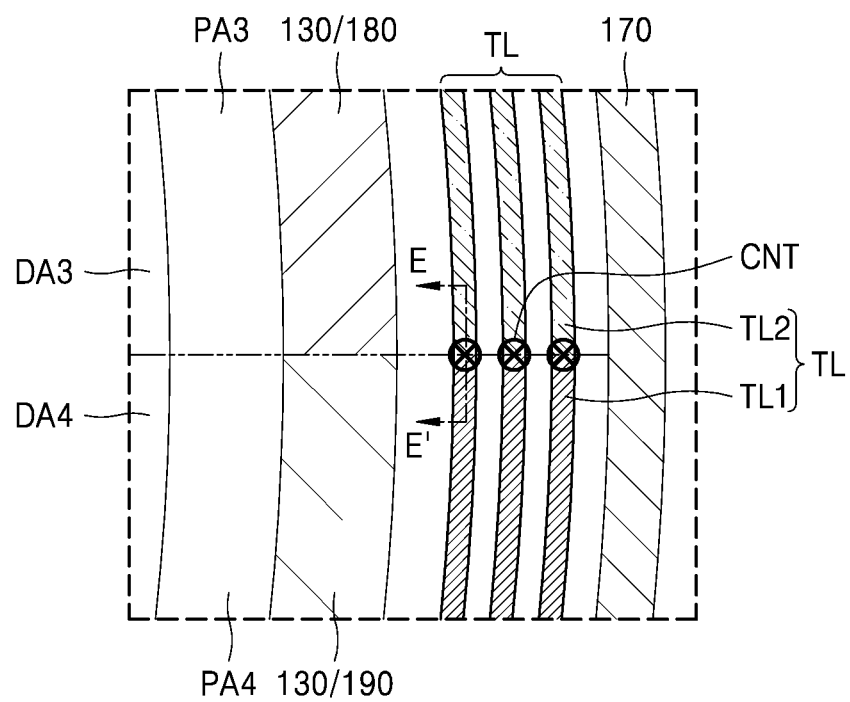
FIG. 18 is a plan view of a portion of a display device according to an exemplary embodiment of the inventive concept.
Figure 19:
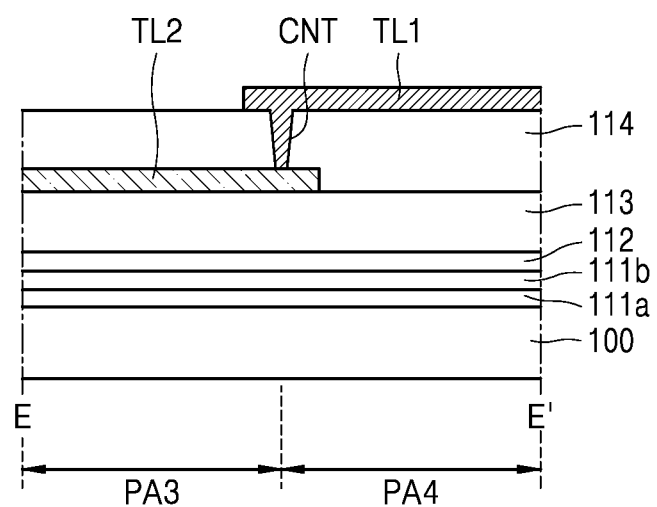
FIG. 19 is a cross-sectional view of a display device taken along line E-E' of FIG. 18.

FIG. 18 is a plan view of a portion of the display device 10' according to an exemplary embodiment of the inventive concept and FIG. 19 is a cross-sectional view of the display device 10' taken along line E-E' of FIG. 18. FIG. 18 corresponds to a region C of FIG. 13.

Referring to FIG. 18, the second scan driving circuit 130 and the test circuit 190 may be arranged in the third peripheral area PA3 outside the third display area DA3, and the second scan driving circuit 130 and the data distribution circuit 180 may be arranged in the fourth peripheral area PA4 outside the fourth display area DA4. The test lines TL and the common power supply line 170 may be arranged in the third peripheral area PA3 and the fourth display area DA4. In an exemplary embodiment of the inventive concept, the test lines TL may be arranged in an area between the second scan driving circuit 130, the data distribution circuit 180, and the test circuit 190 and the common power supply line 170. The test lines TL may be connected to the test circuit 190.

In an exemplary embodiment of the inventive concept, each test line TL may include a first sub-test line TL and a second sub-test line TL2, the first sub-test line TL1 being arranged in the fourth peripheral area PA4, and the second sub-test line TL2 being arranged in the third peripheral area PA3. The first sub-test line TL and the second sub-test line TL2 may be arranged on different layers, and the first sub-test line TL may contact the second sub-test line TL2 through a contact hole CNT.

As described above, the first sub-test line TL may overlap the common power supply line 170 in the fourth peripheral area PA4. Therefore, to prevent the occurrence of a signal interference and a parasitic capacitance between the first sub-test line TL1 and the fan-out unit 160, the first sub-test line TL1 may be arranged on the fourth insulating layer 114 in the fourth peripheral area PA4 as shown in FIG. 19. In an exemplary embodiment of the inventive concept, the first sub-test line TL1 may include the same material as that of the contact metal 1176 of FIG. 7.

The second sub-test line TL2 may be arranged on the third insulating layer 113. In an exemplary embodiment of the inventive concept, the second sub-test line TL2 may include the same material as that of the data line DL and the driving voltage line PL of FIG. 7. As shown in FIG. 19, the first sub-test line TL may be electrically connected to the second sub-test line TL2 through a contact hole CNT in the fourth insulating layer 114.

Although the above embodiments described a display device, the present inventive concept is not limited thereto. For example, a method of manufacturing the display device is within the scope of the present inventive concept.

According to an exemplary embodiment of the present inventive concept, the display device in which the peripheral area outside the display area is minimized may be implemented. However, the present inventive concept is not limited to this effect.

While the inventive concept has been described with reference to one or more exemplary embodiments thereof, it will be understood by those of ordinary skill in the art that various changes in form and details may be made thereto without departing from the spirit and scope of the inventive concept as set forth by the following claims.

What is claimed is:

1. A display device, comprising:
   a substrate including a display area and a peripheral area adjacent to the display area;
   a plurality of data lines extending in a first direction in the display area;
   a fan-out unit arranged in the peripheral area and connected to the plurality of data lines;
   a first signal line arranged in the peripheral area, wherein the first signal line is a test line; and
   a common power supply line arranged in the peripheral area and overlapping the fan-out unit.

2. The display device of claim 1, wherein the first signal line overlaps the fan-out unit.

3. The display device of claim 1, further comprising a test circuit located in the peripheral area,
   wherein the first signal line is connected to the test circuit.

4. The display device of claim 3, wherein the test circuit is located opposite the fan-out unit with the display area therebetween.

5. The display device of claim 1, further comprising:
a driving circuit located in the peripheral area; and
a second signal line connected to the driving circuit,
wherein the first signal line is located between the second signal line and the common power supply line.

6. The display device of claim 5, wherein the first signal line and the second signal line are arranged on different layers.

7. The display device of claim 5, wherein the first signal line and the second signal line include different materials.

8. The display device of claim 5, wherein the second signal line and the common power supply line include the same material.

9. The display device of claim 3, wherein the display area has a non-quadrangular shape.

10. The display device of claim 9, further comprising a data distribution circuit arranged in the peripheral area between the display area and the common power supply line and electrically connected to the plurality of data lines.

11. The display device of claim 10, wherein the data distribution circuit partially circles an outer side of the display area.

12. The display device of claim 10, wherein the data distribution circuit is located between the display area and the first signal line.

13. The display device of claim 10, wherein the data distribution circuit is symmetrical to the test circuit about an axis crossing the display area therebetween.

14. The display device of claim 10, further comprising:
a pixel circuit and a display element, the pixel circuit being arranged in the display area and including a thin film transistor and a storage capacitor, wherein the display element is electrically connected to the pixel circuit,
wherein the display element includes a first electrode, a second electrode, and an intermediate layer between the first electrode and the second electrode,
the thin film transistor includes a semiconductor layer, a gate electrode, and an electrode layer, wherein the gate electrode overlaps the semiconductor layer, and the electrode layer is connected to the semiconductor layer, and
the storage capacitor includes a bottom electrode overlapping a top electrode, the bottom electrode including the same material as that of the gate electrode.

15. The display device of claim 14, wherein the second signal line includes the same material as that of the electrode layer.

16. The display device of claim 14, wherein the common power supply line includes the same material as that of the electrode layer.

17. The display device of claim 14, wherein the fan-out unit includes a plurality of first wirings and a plurality of second wirings that are separated from each other and are alternately arranged,
wherein the plurality of first wirings include the same material as that of the gate electrode, and the plurality of second wirings include the same material as that of the top electrode.

18. The display device of claim 14, further comprising a connection electrode arranged between the electrode layer and the pixel electrode to electrically connect the electrode layer to the pixel electrode,
wherein the first signal line includes the same material as that of the connection electrode.

19. The display device of claim 18, wherein the display area is circular, and
the first signal line includes a first sub-signal line and a second sub-signal line, wherein the first sub-signal line semi-circumnavigates a first side of the display area, and the second sub-signal line semi-circumnavigates a second side of the display area.

20. The display device of claim 19, wherein the first sub-signal line and the second sub-signal line are arranged on different layers and are electrically connected to each other through a contact hole formed in an insulating layer therebetween.

21. The display device of claim 19, wherein the first sub-signal line includes the same material as that of the connection electrode, and
the second sub-signal line includes the same material as that of the electrode layer.

22. The display device of claim 1, wherein the common power supply line surrounds an outer side of the display area and has one open side.

23. A display device, comprising:
a substrate including a display area and a peripheral area outside the display area, wherein the display area has a non-quadrangular shape;
a driving circuit arranged in the peripheral area;
a fan-out unit arranged in the peripheral area between the display area and the driving circuit;
a test circuit arranged in the peripheral area;
a test line arranged in the peripheral area around the display area and connected to the test circuit; and
a common power supply line arranged in the peripheral area adjacent to the test line and partially overlapping the fan-out unit.

24. The display device of claim 23, wherein a portion of the test line overlaps the fan-out unit.

25. The display device of claim 23, wherein the common power supply line circumnavigates an outer side of the display area.

26. The display device of claim 23, wherein the test line circumnavigates an outer side of the display area.

27. A display device, comprising:
a substrate including a display area and a peripheral area surrounding the display area;
a fan-out unit arranged in the peripheral area and connected to data lines extending from the display area;
a test line arranged in the peripheral area and circumnavigating the display area; and
a power supply line arranged in the peripheral area and overlapping the fan-out unit.

28. The display device of claim 27, further comprising a data driving circuit connected to the fan-out unit, wherein the fan-out unit is disposed between the data driving circuit and the test line.

29. The display device of claim 27, wherein the test line is disposed between the power supply line and a scan driving circuit.

30. The display device of claim 27, wherein the test line is disposed between the power supply line and a data distribution circuit.

* * * * *